(12) United States Patent
Jochim et al.

(10) Patent No.: US 10,709,034 B2
(45) Date of Patent: Jul. 7, 2020

(54) SUPPORTING RACK-MOUNTED COMPUTING DEVICES

(71) Applicant: Google LLC, Mountain View, CA (US)

(72) Inventors: Jayson Michael Jochim, Mountain View, CA (US); Michael Chi Kin Lau, San Francisco, CA (US); Winnie Leung, Palo Alto, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/901,058

(22) Filed: Feb. 21, 2018

(65) Prior Publication Data
US 2019/0261534 A1    Aug. 22, 2019

(51) Int. Cl.
*H05K 7/14* (2006.01)
*H05K 7/20* (2006.01)

(52) U.S. Cl.
CPC ......... *H05K 7/1497* (2013.01); *H05K 7/1488* (2013.01); *H05K 7/1489* (2013.01);
(Continued)

(58) Field of Classification Search
CPC .. H05K 7/1497; H05K 7/1489; H05K 7/1492; H05K 7/1495; H05K 7/20781
See application file for complete search history.

(56) References Cited

U.S. PATENT DOCUMENTS

| | | |
|---|---|---|
| 3,924,370 A | 12/1975 | Cauceglia et al. |
| 4,992,669 A | 2/1991 | Parmley |

(Continued)

FOREIGN PATENT DOCUMENTS

| | | |
|---|---|---|
| CN | 1543758 A1 | 11/2004 |
| CN | 1732727 A1 | 2/2006 |

(Continued)

OTHER PUBLICATIONS

'www.werc.org' [online] "TranSystems: 11th Edition Rules of Thumb Warehousing & Distribution Guidelines," Available on or before Dec. 13, 2011, [retrieved on Jan. 4, 2018] Retrieved from Internet: URL<http://www.werc.org/assets/1/Publications/TranSystems%20Rules%20of%20Thumb%202010%20v2.pdf> via the Wayback Machine at Internet: URL<https://web.archive.org/web/20110901000000*/http://www.werc.org/assets/1/Publications/TranSystems%20Rules%20of%20Thumb%202010%20v2.pdf> 16 pages.

(Continued)

*Primary Examiner* — Jayprakash N Gandhi
*Assistant Examiner* — Hung Q Dang
(74) *Attorney, Agent, or Firm* — Fish & Richardson P.C.

(57) ABSTRACT

A data center rack system includes a rack housing that includes side panels and a top panel coupled to the side panels, the top and side panels defining a rack volume sized to enclose a plurality of data center server rack trays, each of the data center server rack trays configured to support a plurality of heat generating electronic devices; and a rack bottom coupled to the side panels to at least partially define the rack volume, the rack bottom including a bottom panel having a top surface coupled to the side panels and a plurality of blocks coupled to a bottom surface of the bottom panel opposite the top surface, at least one pair of the plurality of blocks defining an opening between the blocks and below the bottom surface of the bottom panel and sized to receive a lifting member of a lifting machine.

13 Claims, 11 Drawing Sheets

(52) U.S. Cl.
CPC ......... *H05K 7/1492* (2013.01); *H05K 7/1495* (2013.01); *H05K 7/20781* (2013.01)

(56) References Cited

U.S. PATENT DOCUMENTS

| | | | |
|---|---|---|---|
| 5,345,779 | A | 9/1994 | Feeney |
| 5,953,930 | A | 9/1999 | Chu |
| 6,374,627 | B1 | 4/2002 | Schumacher |
| 6,560,131 | B1* | 5/2003 | vonBrethorst ........ H02J 7/0042 |
| | | | 361/673 |
| 6,819,563 | B1 | 11/2004 | Chu |
| 6,859,366 | B2 | 2/2005 | Fink |
| 7,011,576 | B2 | 3/2006 | Sharp |
| 7,511,960 | B2* | 3/2009 | Hillis ....................... G06F 1/20 |
| | | | 165/80.4 |
| 7,978,463 | B1 | 7/2011 | Haun |
| 8,763,414 | B2 | 7/2014 | Carlson |
| 8,797,718 | B2* | 8/2014 | Fontana ................... H02B 1/20 |
| | | | 29/592.1 |
| 2002/0055329 | A1 | 5/2002 | Storck |
| 2004/0132398 | A1 | 7/2004 | Sharp |
| 2004/0158380 | A1* | 8/2004 | Farber ................... B66F 17/003 |
| | | | 701/50 |
| 2005/0170770 | A1 | 8/2005 | Johnson |
| 2006/0028171 | A1 | 2/2006 | Marraffa |
| 2007/0171613 | A1 | 7/2007 | McMahan |
| 2007/0178369 | A1 | 8/2007 | Conrardy |
| 2007/0281639 | A1 | 12/2007 | Clidaras |
| 2008/0164794 | A1 | 7/2008 | Lai |
| 2011/0122561 | A1 | 5/2011 | Pierson et al. |
| 2012/0164930 | A1 | 6/2012 | Murayama |
| 2012/0200992 | A1 | 8/2012 | Schmitt et al. |
| 2012/0201002 | A1 | 8/2012 | Schmitt et al. |
| 2015/0334879 | A1* | 11/2015 | Fricker .............. H05K 7/20809 |
| | | | 361/679.47 |
| 2017/0181314 | A1* | 6/2017 | Leigh ................... H05K 7/1492 |
| 2017/0359918 | A1 | 12/2017 | Miroslaw et al. |

FOREIGN PATENT DOCUMENTS

| | | |
|---|---|---|
| JP | 11148710 A1 | 6/1999 |
| JP | 2003035411 A1 | 2/2003 |
| WO | WO2007139560 A1 | 12/2007 |

OTHER PUBLICATIONS

PCT International Search Report and Written Opinion in International Application No. PCT/US2019/018762, dated May 16, 2019, 15 pages.

* cited by examiner

SUPPORTING RACK-MOUNTED COMPUTING DEVICES

TECHNICAL FIELD

The present disclosure relates to systems and methods for supporting rack-mounted computing devices, such as server devices, networking devices, and other computing devices in a data center.

BACKGROUND

Planning for and provisioning physical network infrastructure resources for a large scale data center deployment is a challenging task. Co-locating networking switches and information technology (IT) equipment racks in the same space results in inefficiencies and reduced flexibility. For example, networking provisioning may cause underutilization of power, cooling, and space resources. Further, networking equipment often has higher availability requirements due to their potential to impact larger failure domains. In some cases, complex networking cable routes and non-optimal cable path lengths occur due to cable tray conveyance in multiple elevations in a grid configuration above IT equipment. Such circumstances may also cause inflexibility to experiment with alternative network topologies.

SUMMARY

In a general implementation, a data center rack system includes a rack housing that includes side panels and a top panel coupled to the side panels, the top and side panels defining a rack volume sized to enclose a plurality of data center server rack trays, each of the data center server rack trays configured to support a plurality of heat generating electronic devices; and a rack bottom coupled to the side panels to at least partially define the rack volume, the rack bottom including a bottom panel having a top surface coupled to the side panels and a plurality of blocks coupled to a bottom surface of the bottom panel opposite the top surface, at least one pair of the plurality of blocks defining an opening between the blocks and below the bottom surface of the bottom panel and sized to receive a lifting member of a lifting machine.

In an aspect combinable with the general implementation, the side panels are integrally formed with the top panel and the bottom panel.

In another aspect combinable with any one of the previous aspects, the plurality of blocks include at least three blocks, each of the at least three blocks extending in contact with the bottom surface of the bottom panel from a front edge of the bottom panel to a back edge of the bottom panel and in parallel with a width of the side panels.

In another aspect combinable with any one of the previous aspects, the at least three blocks include at least two pairs of blocks, a first pair of the blocks defining a first opening between the first pair of blocks and below the bottom surface of the bottom panel and sized to receive a first lifting member of the lifting machine, a second pair of the blocks defining a second opening between the second pair of blocks and below the bottom surface of the bottom panel and sized to receive a second lifting member of the lifting machine.

In another aspect combinable with any one of the previous aspects, the first opening is defined by a length that extends from the front edge of the bottom panel to the back edge of the bottom panel and a width that extends between respective blocks of the first pair of blocks, the length being greater than the width.

In another aspect combinable with any one of the previous aspects, the rack bottom further includes a cooling liquid inlet and a cooling liquid outlet.

In another aspect combinable with any one of the previous aspects, the rack bottom further includes at least one electrical power inlet.

In another aspect combinable with any one of the previous aspects, the rack bottom further includes at least one network connection.

Another aspect combinable with any one of the previous aspects further includes a utility track that extends at least partially through the rack volume, the utility track including: (i) a plurality of electric power outlets electrically coupled to the electrical power inlet; (ii) a plurality of network outlets communicably coupled to the network connection; or (iii) both (i) and (ii).

In another aspect combinable with any one of the previous aspects, the plurality of blocks include at least three blocks, each of the at least three blocks extending in contact with the bottom surface of the bottom panel from a first side edge of the bottom panel to a second side edge of the bottom panel and orthogonally with a width of the side panels.

Another aspect combinable with any one of the previous aspects further includes at least one seismic restraint coupled to the housing.

In another general implementation, a method for managing data center racks includes installing a plurality of data center server rack trays into a rack volume of a data center rack system, each of the data center server rack trays including a plurality of heat generating electronic devices, the data center rack system including a rack housing that includes side panels and a top panel coupled to the side panels, the top and side panels defining the rack volume, and a rack bottom coupled to the side panels to at least partially define the rack volume, the rack bottom including a bottom panel having a top surface coupled to the side panels and a plurality of blocks coupled to a bottom surface of the bottom panel opposite the top surface; loading the data center rack on a lifting machine by moving at least one lifting member of the lifting machine into an opening defined between at least one pair of the plurality of blocks and below the bottom surface of the bottom panel; and moving the data center rack system through a data center with the lifting machine.

In an aspect combinable with the general implementation moving the data center rack system through the data center includes lifting the data center rack system to a height above a floor surface of the data center greater than a height of the data center rack system.

Another aspect combinable with any one of the previous aspects further includes installing, with the lifting machine, the lifted data center rack system into cell of a data center rack support structure.

In another aspect combinable with any one of the previous aspects, the plurality of blocks include at least three blocks, each of the at least three blocks extending in contact with the bottom surface of the bottom panel from a front edge of the bottom panel to a back edge of the bottom panel and in parallel with a width of the side panels.

In another aspect combinable with any one of the previous aspects, the at least three blocks include at least two pairs of blocks, a first pair of the blocks defining a first opening between the first pair of blocks and below the bottom surface of the bottom panel and sized to receive a first lifting member of the lifting machine, a second pair of the blocks defining a second opening between the second pair of blocks and below the bottom surface of the bottom panel and sized to receive a second lifting member of the lifting machine.

Another aspect combinable with any one of the previous aspects further includes supplying electrical power to an electrical power inlet mounted in the rack bottom of the data center rack system; and supplying data to a network connection mounted in the rack bottom of the data center rack system.

Another aspect combinable with any one of the previous aspects further includes conducting the electrical power through a utility track that extends at least partially through the rack volume and to a plurality of electric power outlets mounted in the utility track; and communicating the data through the utility track and to at least one network connection outlet mounted in the utility track.

Another aspect combinable with any one of the previous aspects further includes conducting the electrical power from the plurality of electric power outlets to the plurality of data center server rack trays; and communicating the data from the at least one network connection outlet to at least one of the plurality of data center server rack trays.

Another aspect combinable with any one of the previous aspects further includes supplying a cooling liquid to a cooling liquid inlet mounted in the rack bottom of the data center rack system.

In another aspect combinable with any one of the previous aspects, the lifting machine includes a computer-controlled automated service machine.

Implementations according to the present disclosure may include one or more of the following features. For example, implementations according to the present disclosure may provide for a dedicated networking space that allows a more tightly packed aggregation of networking switches and a reduction of total cable lengths. As another example, implementations according to the present disclosure may increase a speed and efficiency of deploying networks within a data center among and between information technology (IT) equipment (e.g., electronic devices such as servers that are primarily tasked with consumer related jobs such as Internet searches, electronic mail, cloud computing, and otherwise). In some implementations, network deployments can be sped up due to simpler and shorter cable runs between network switches and IT equipment. As another example, implementations according to the present disclosure may allow for a reduced latency of communication among IT equipment and, e.g., networks external to the data center, by connecting the IT equipment with network resources through shorter, more direct cabling runs as compared to conventional data centers. This may be especially true for high performance IT equipment. As another example, implementations according to the present disclosure may more efficiently evaluate various networking topologies without disturbing IT equipment deployments before such topologies are actually implemented. Further, power and cooling solutions for an IT equipment layer (or layers) and a network switch layer can be sized and implemented according to their availability targets, which are usually different. Moreover, resources can be fully dedicated to IT equipment instead of being de-rated due additional networking requirements. In some implementations, total networking cable path lengths can be reduced by placing aggregation networking switches closer together. In the case of fiber optic cabling, a reduction in cable length may enable the use of more economically efficient optical fiber cables and optical fiber transceivers. Further, more economically efficient transceivers, active optical cables, or both may be used due to implementations according to the present disclosure.

Implementations according to the present disclosure may include one or more of the following features. For example, installation of networking cabling between networking switches and IT equipment can be shortened and simplified and may lend itself to motorized, pulley-driven cable runs as opposed to manually installed cable runs to reduce networking deployment time. Further, such implementations may also enable the use of pre-fabricated drop-in networking cable assemblies to reduce networking deployment time. Further, implementations according to the present disclosure may provide for an independently reconfigurable networking layer without disturbing the IT layers. In addition, implementations according to the present disclosure may provide for the potential for variable power and thermal domains within the data center.

Implementations according to the present disclosure may include one or more of the following features. For example, implementations of a palletized server rack (e.g., a server rack with an integral pallet portion) may allow for more efficient movement (e.g., in two or three dimensions) within a data center to place the server rack at an optimal position within a row, column, or other configuration of server racks. As another example, implementations of a palletized server rack may include integral seismically-rated support structures. As yet another example, implementations of a palletized server rack may be machine-moved, such as by forklift, lift truck, or other pallet-lifting equipment that may be common to a data center (e.g., a data center loading dock or otherwise).

The details of one or more implementations of the subject matter described in this disclosure are set forth in the accompanying drawings and the description below. Other features, aspects, and advantages of the subject matter will become apparent from the description, the drawings, and the claims.

DETAILED DESCRIPTION

Figure 1:
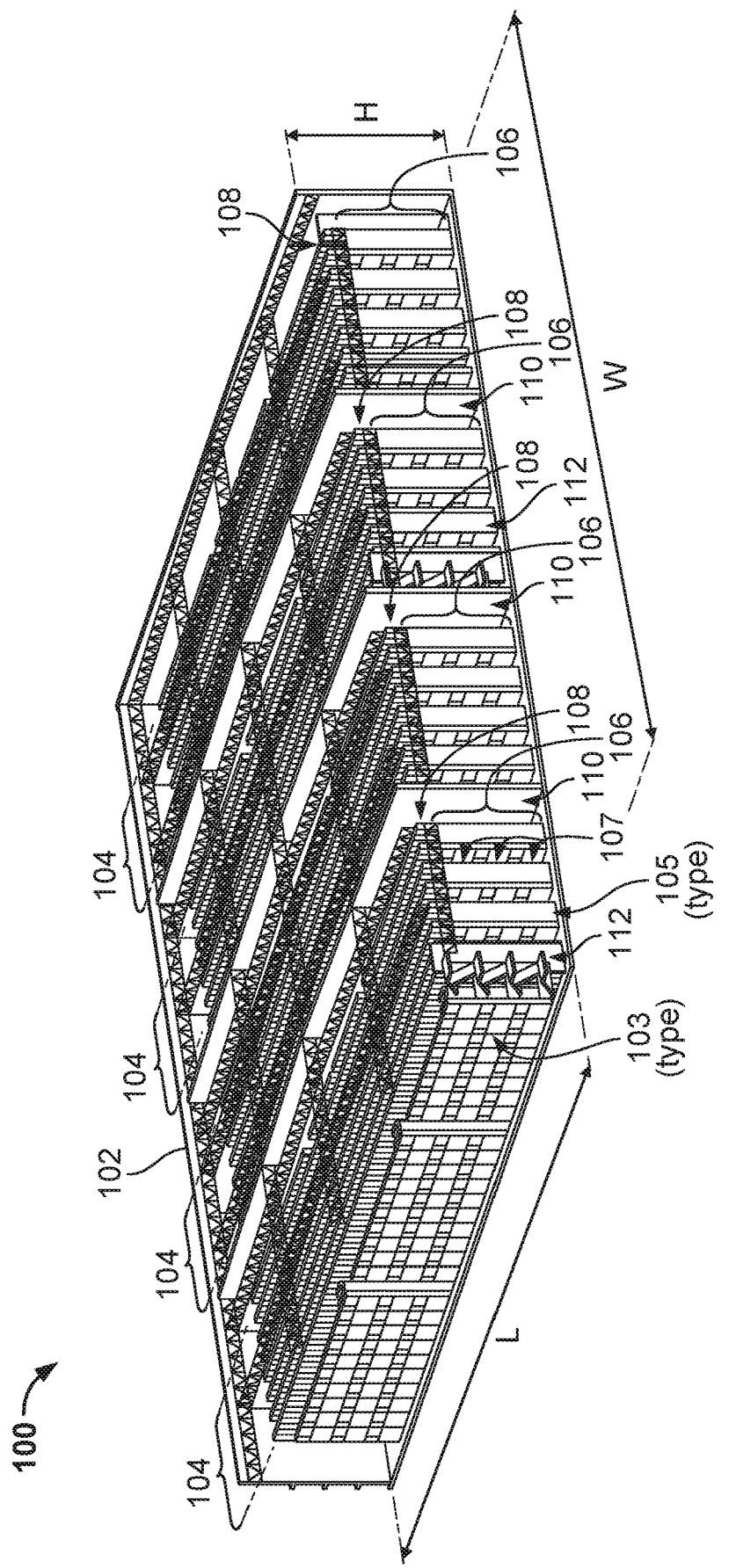
FIG. 1 is an isometric illustration of a data center that includes stacked rows of IT equipment according to the present disclosure.

A data center according to the present disclosure includes multiple (tens, hundreds, thousands, tens of thousands)

electronic components, such as servers, processors, memory modules, network switches, and other components. The components, in some aspects, are arranged in server racks or network racks that support (e.g., physically, with electricity, with cooling) the components. For example, server racks and network racks may be arranged in rows that include two or more stacked layers of the components. In some aspects, certain components, such as information technology (IT) components (e.g., servers, data storage) are arranged in rows of one or more layers with communicably coupled networking components (e.g., switches) arranged in a layer separate from the IT component layers (e.g., vertically above).

In some aspects, the IT components may be serviced (e.g., deployed into racks, replaced, repaired, or otherwise) by one or more automated equipment. In some aspects, the automated equipment may be human-operated or human-controlled (e.g., moved around the data center to service the components). In some aspects, the automated equipment may be computer-controlled (e.g., by specified software instructions) to move around the data center to service the components. In some aspects, the automated equipment may be computer-controlled according to artificial intelligence (AI) principles in order to move around the data center to service the components.

Implementations according to the present disclosure also include a palletized data center rack. For example, a data center rack system that includes a palletized base may serve as an interface point for rack movement, such as with powered industrial equipment. This can enable movement of 4000 or more pound, fully loaded rack systems at a higher speed, efficiency, and to positions that cannot be achieved today with human handling only. When deployed, the palletized base can also serve as a common seismic attachment point, which is typically handled with custom configurations depending on the data center. Thus, seismic features can be incorporated directly into the data center rack system. In some aspects, the palletized rack, as a whole system, may also include features that facilitate the transmission of seismic loads, as well as provide safety from tip-over due to an unbalance (e.g., due to an external force or otherwise).

To protect IT equipment supported in the rack system, the data center rack system may also provide mechanical isolation and dampening for sensitive IT payloads during transportation and handling. The palletized base can also provide an interface to electrical power, grounding, networking, cooling liquid, and cooling fans/infrastructure. With variants of conventional racks, designing a common interface may provide the ability to pre-configure the rack system for faster deployment into data centers with a single action.

Further, in some aspects, features added to the palletized base may be specifically tuned for the IT payloads being deployed, which may be unique to the IT equipment supported in the data center rack system. The scale of the interface may be targeting capacity of particular disciplines at a large data center, which is typically not handled in a blind-mate interface. Electrical and water connections are conventionally handled by manual fastening; tool-free and "automatic" (e.g., without manual fastening by a human operator) connections when the rack is deployed using blind-mate quick disconnects (e.g., connectable without human viewing required to make a fluid connection) in the palletized base may speed deployment.

FIG. 1 is an isometric illustration of a data center 100 that includes stacked rows of servers and networking switches. Data center 100 includes a data center shell building 102 that defines a human-occupiable workspace into which one or more (four shown here) clusters 104 of rows 105 of data center racks 103 are installed. As shown, certain clusters 104 of the rows 105 are separated by fire-rated walls 110. In this example, a particular cluster 104 includes multiple (one or more) rows 105 of data center racks 103. As shown in the implementation of data center 100, each cluster 104 includes eight rows of racks 103. The eight rows 105 of racks 103 in each cluster 104 includes four pairs of rows 105 with each pair of rows 105 being arranged as two back-to-back rows 105 of data center racks 103. As explained more fully in the present disclosure, two back-to-back rows 105 of data center racks 103 may be arranged so that a warm air aisle 112 is defined there between and positioned to receive an airflow from back sides of the two rows 105 of data center racks 103 that has been warmed by many (e.g., tens, hundreds, thousands, tens of thousands within the data center 100) of heat-generating IT computing devices supported in each rack 103. Further, pairs of rows 105 of data center racks 103 may be separated by a cold air aisle through which a cooling airflow (to cool the heat-generating IT computing devices) is circulated. Thus, in example implementations of the data center 100, back-to-back rows 105 of racks 103 are separated by warm air aisles (adjacent open back sides of the data center racks 103) while pairs of rows 105 of data center racks 103 are separated by cold air aisles (adjacent open front sides of the data center racks 103).

As further illustrated in FIG. 1, each row 105 of data center racks 103 are arranged in multiple (more than one) vertical layers 107. Each layer 107 of data center racks 103 includes a horizontal row 105 of the racks 103 as determined by a lengthwise dimension (shown here as L) of the data center shell building 102. Further each layer 107 includes at least one other layer 106 of data center racks 103 positioned below or above (or both). Thus, layers 107 of the rows 105 of data center racks 103 are defined and positioned in a vertical direction (shown as H) in the shell building 102; rows 105 of the data center racks 103 are defined and positioned in the lengthwise dimension, L; and clusters 104 of the rows 105 of the data center racks 103 are defined and positioned along a widthwise dimension (shown as W) in the shell building 102.

In the illustrated implementation of data center 100, each of the layers 107 may include data center racks 103 that support IT equipment or network switch equipment that communicably couples (e.g., with fiber optic or other network cabling) the IT equipment (e.g., to other IT equipment, a network internal to the data center 100, or a network external to the data center 100). For example, as shown in FIG. 1, IT equipment layers 106 are arranged in three of the layers 107, including a bottom layer 107 (e.g., supported on a floor of the data center 100), a middle layer 107 (e.g., vertically mounted on the bottom layer 107), and a top layer 107 (e.g., vertically mounted on the middle layer 107). Mounted above the top layer 107 of IT equipment layers 106 is a networking layer 108 that supports network switches (e.g., stage 2 switches). In some aspects, the networking layer 108 is positioned on a mezzanine of the data center 100 (e.g., a human-occupiable structure at a height of the networking layer 108).

Thus, the data center 100 is an example implementation of a data center that includes a physically separate floor for the network aggregation switches, or stage 2 switches. The networking plane, in data center 100, is located on a separate floor (e.g., mezzanine) above (or a subfloor below) a data center floor that supports IT equipment (e.g., servers and storage machines). In some aspects, moving the networking switches to a separate area (e.g., layer 108) may eliminate many of the cable trays required in the IT equipment area (e.g., layers 106) since most of the cable trays are used to support the network links for network switches (e.g., stage 2) and above.

Data center 100 also includes (not specifically shown in FIG. 1) physical cabling that is routed between the layers 107 (e.g., among IT layers 106, between IT layers 106 and network layer 108). For example, pre-terminated fiber optic cable bundles can be routed between and among layers 107 to directly connect, e.g., a stage 1 switch to a stage 2 switch. Alternatively, patch panels can be used as termination points between IT layers 106 (e.g., that include server and storage machines and stage 1 switches) and the network layer 108 (e.g., that includes stage 23 switches) with structured fiber optic cabling arranged between the layers 106 and 108.

Data center 100 may also allow for or facilitate an optimized layout of IT equipment layers 106 and networking layer 108 even though their respective requirements are different. The networking layer 108 may enable a variety of network switch layouts that would be optimized from a network cabling perspective for different topologies (for example, bus, ring, star, tree, mesh, or hybrids). The networking layer 108 that includes support structure (e.g., racks 103) for the network switches (e.g., stage 2) can be arranged to reduce a distance between switching nodes of the network layer 108. For example, cable trays (in the network layer 108 or between the network layer 108 and IT layers 106) can be deployed on a tighter rectangular grid or in radial patterns to reduce network cable path lengths and simplify network cable routes. On the IT equipment layers 106, data center racks 103 can be arranged in rows to maximize deployment density. Further, in the networking layer 108 (e.g., a raised mezzanine or lowered sub-floor), non-traditional cable support structures or cabling planes can be used to convey networking cables on the networking layer 108 with multi-directional runs (e.g., as opposed to conventional cabling runs that may only allow bi-directional layouts of networking cables). In some aspects, pre-built, large network cabling assemblies can be dropped in and connected to data center racks 103 in the networking layer 108 that are deployed in closer proximity to each other in set patterns for faster deployment times.

By taking advantage of a vertical dimension in three-dimensional space (the interior environment of the data center 100) to arrange network switches (e.g., stage 2) and IT equipment that need to be closely interconnected, improvement in fiber optic cabling inventory for the data center 100 can be simplified and reachable positions of fiber optic cable length limitations can be maximized. For example, fiber optic cable reach (e.g., how far an operational cable may extend between two points) may become shorter as bandwidth increases, and therefore, increasing a number of reachable IT equipment rack spots may increase cable efficiency. By taking advantage of the vertical dimension, there may be increased capability to land IT equipment or groups of IT equipment in any location in a cluster without having to consider network cabling length constraints.

Additionally, a dedicated network layer 108 allows for many operational benefits throughout the life cycle of the data center 100. For instance, an increase in network deployment velocity can be expected via separation of network cabling routing paths leading to easier incremental network turn-ups, decommissions, and transformations. Further, operations can be accelerated by separation of trades and de-conflicting of areas turned-up by different disciplines (e.g. network installers, electrical, IT equipment installers).

In particular implementations, a cooling unit that operates within the layer(s) of mixed computing/cooling equipment may use a cooling liquid (e.g., chilled water or chilled glycol from one or more chillers, condenser water or other evaporatively cooled liquid, or otherwise) from a data center building central plant. The cooling unit utilizes the cooling liquid in an air-to-liquid heat exchanger (e.g., liquid or refrigerant cooling coil) to cool a flow of heated air from multiple server racks. The cooling unit may include one or more fans that are controllably operated to circulate the heated airflow from the server racks to the cooling unit, through the air-to-liquid heat exchanger to cool the heated airflow, and from the cooling unit (as a cooling airflow) back, to the server racks.

The layer(s) of mixed computing/cooling equipment and IT equipment layer(s) may be deployed in a data center building in an incremental process. For example, an initial amount of IT power load (that generates a particular heat load) and networking equipment (that may also generate a heat load) may be determined. For an initial deployment, the IT power load may be in a single zone (e.g., row, cluster, columns, rows and columns, or combinations thereof) or in or in multiple zones (e.g., multiple rows, multiple clusters, multiple layers of rows or clusters). Likewise, the determined networking load may be in a single layer (e.g., in or on a mezzanine or sub-floor layer) or multiple layers. Based on the determined IT power load and networking equipment (and corresponding heat load), cooling capacity (e.g., per zone) may be determined, thereby determining a number of cooling units needed per zone (e.g., based on a maximum cooling capacity per cooling unit). IT equipment (e.g., server racks) and networking equipment may be deployed in the data center (e.g., within server rack frame assemblies arranged in one or more vertical layers) along with the determined number of cooling units (also within the server rack frame assemblies arranged in one or more vertical layers). For example, the cooling modules may be deployed interspersed in between server racks within the frame assembly, e.g., in particular locations (e.g., bays) to account for cooling requirements dictated by the server rack placements.

The initial deployment process described above can be iterative and repeated for technology refreshes (e.g., replacement of particular server racks with other, higher/lower power IT server racks or networking equipment) or new deployments (e.g., addition of server racks and networking equipment). In each iteration, based on the iteratively determined IT load and networking equipment (and corresponding determined heat load), a number and/or location of cooling units can be re-calculated. For example, if low powered server racks are being replaced with higher (relatively) powered server racks to increase a server rack power density of the data center or zone of the data center, the cooling capacity may be recalculated and cooling units can be added for the additional cooling power. Similarly, cooling units could be removed when server rack power density is reduced in the data center or zone of the data center. With incrementally deployed cooling units, cooling could be "as needed" and properly sized based on the deployed IT equipment in each zone (e.g., single layer row, portion of a single layer row, multi-layer row, or portion of a multi-layer row). For example, for low power density server racks, fewer cooling units may be deployed within a particular zone, while a larger number of cooling units may be needed for high power density server racks within a particular zone.

Incremental, mixed computing/cooling equipment deployment can be implemented in different data center equipment architectures. For example, although the present disclosure describes single and multi-level row-based architectures, other, non-linear architectures (e.g., single or multi-level clusters) can also be implemented according to the present disclosure. Further, although layers of mixed computing/cooling equipment architectures are shown, the cooling equipment may be extracted from the layers of computing equipment and implemented, e.g., as overhead cooling, underfloor cooling, end of row cooling, conventional CRAC cooling, or otherwise.

Figure 2A:
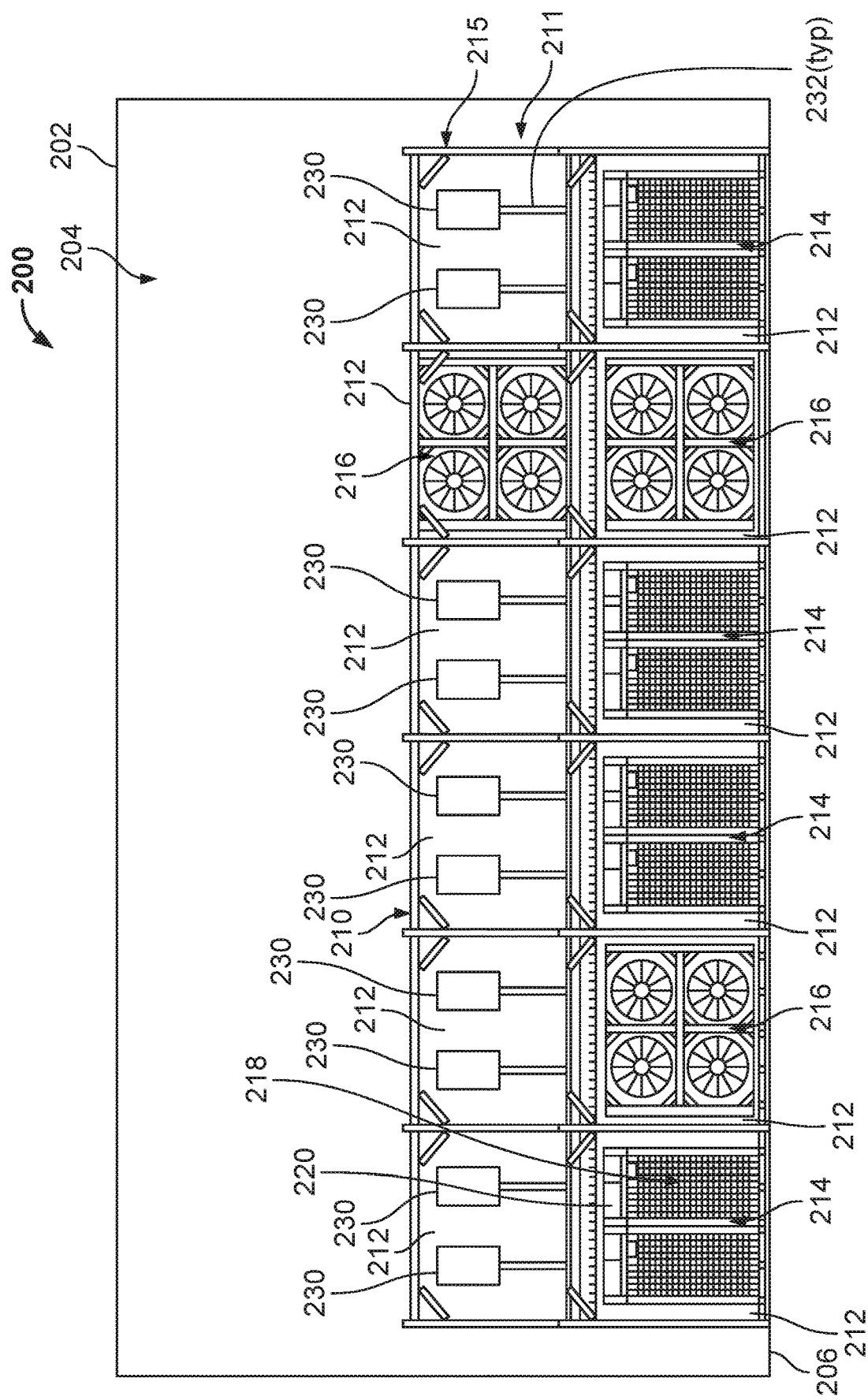
FIGS. 2A-2B are schematic illustrations of a side and end view, respectively, of an example implementation of a data center system that includes an IT equipment layer and a networking switch layer according to the present disclosure.
Figure 2B:
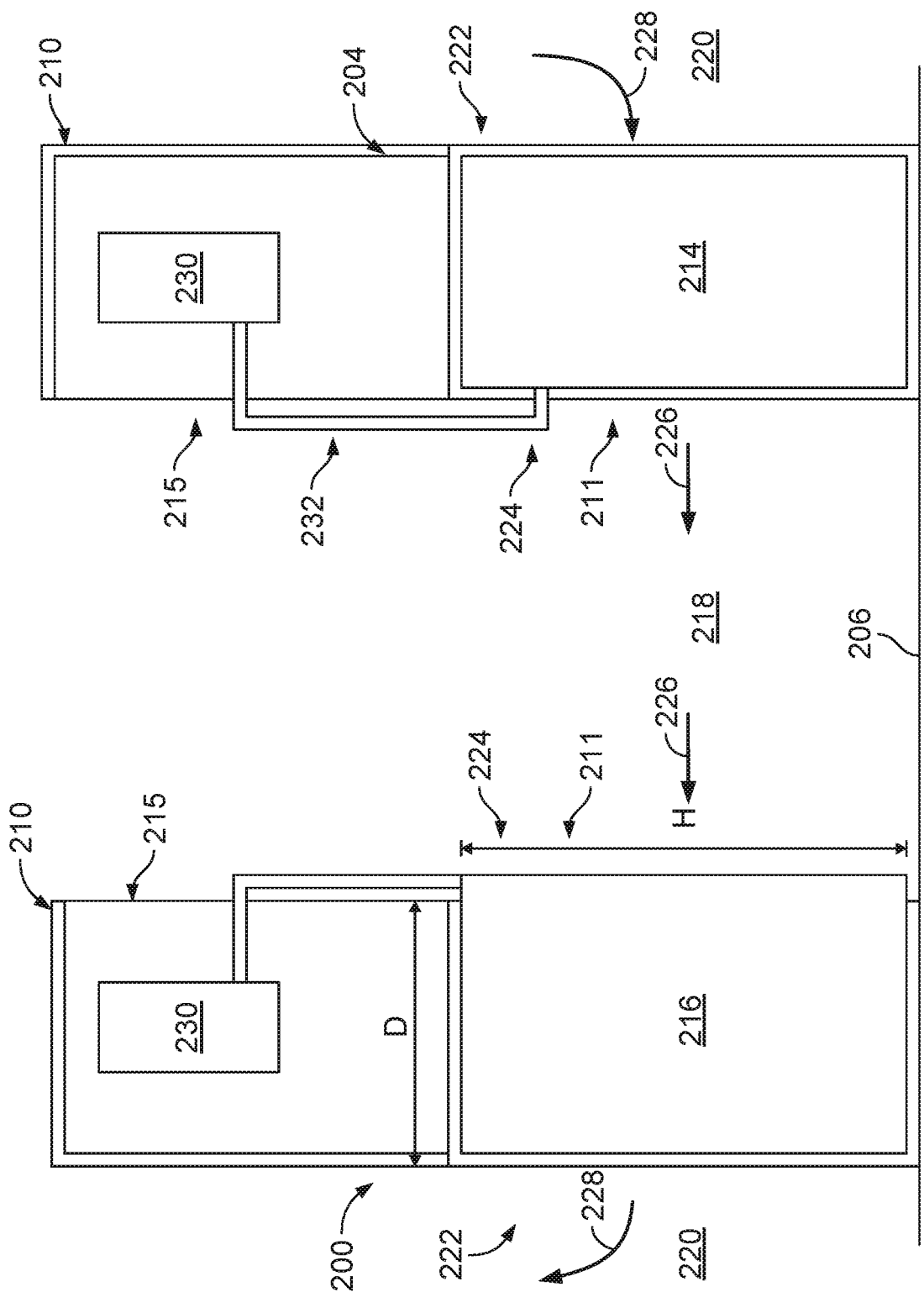

FIGS. 2A-2B are schematic illustrations of a side and end view, respectively, of an example implementation of a data center system 200 that includes a single, mixed computing and cooling layer 211 positioned in a human-occupiable workspace 204 of a data center building 202 with a networking layer 215 positioned above the computing/cooling layer 211 on a data center floor 206. As shown in this example implementation, the data center system 200 includes a layer 211 of server racks 214 and cooling units 216 that are positioned in a frame assembly 210. In this example, the layer 211 is arranged in a row 208 (e.g., linear or substantially linear arrangement of the frame assembly 210). In alternative arrangements, the layers 211 and 215 may be arranged in a non-linear frame assembly, such as, for instance, a circular or partially circular frame assembly or otherwise.

As shown in FIGS. 2A-2B, the networking layer 215 is positioned on top of the computing layer 211. In this example, the networking layer 215 include network switches 230 (e.g., stage 2 switches) positioned within bays 212 of the frame assembly 210 and connected, via network cabling 232 (e.g., fiber optic or otherwise) to the IT equipment in layer 211 (e.g., one or more devices in the server racks 214). For example, in some aspects, particular network switches 230 in a particular bay 212 of layer 215 may be coupled via the network cabling 232 to server racks 214 that are located in a particular bay 212 of layer 211 that is directly below (e.g., vertically) the particular bay 212 of layer 215. In some aspects, particular network switches 230 in a particular bay 212 of layer 215 may be coupled via the network cabling 232 to server racks 214 that are located in a particular bay 212 of layer 211 that is indirectly below (e.g., vertically below and horizontally offset by one bay 212) the particular bay 212 of layer 215. Even further, in some aspects, particular network switches 230 in a particular bay 212 of layer 215 may be coupled via the network cabling 232 to server racks 214 that are located in a particular bay 212 of layer 211 that is indirectly below (e.g., vertically below and horizontally offset by more than one bay 212) the particular bay 212 of layer 215. In short, networking switches 230 may be connected via the cabling 232 to server racks 214 that are vertically below, as well as vertically below and offset.

In some aspects, networking switches 230 may be relatively large switches (e.g., several to tens of RU's (Rack Units) tall or many 1-2RU tall switches). For example, in some aspects, the switches 230 may be network fabric racks that are made up of several line cards (with the switch chips) that plug into a large multi-RU chassis that contains a backplane that connects the line cards in a desired fashion. In other cases, such network fabric racks can be defined using many (12+) 1RU switches connected to each other in a desired fashion. Racks that support the switches 230 may be closely coupled to build even larger configurations of switch networks. Such switch racks may also contain power conversion, batteries, or passive fiber patch panels.

As shown in FIGS. 2A-2B, the networking cabling 232, and thus the communication connections between server racks 214 (e.g., through the network switches 230), between server racks 214 and a network external to the data center 200 (e.g., through network switches 230), and between network switches 230 (e.g., through server racks 214 or from/to an external network), are largely unimpeded by, e.g., cooling infrastructure, such as cooling units 216, ductwork, piping, electrical cabling, or other cooling equipment, due to the positioning of the network switches 230 in the layer 215. By mounting the networking layer 215 vertically above the IT equipment layer 211, the Z, or vertical, dimension of the human-occupiable workspace 204 may be taken advantage of as opposed to conventional data centers. This may also provide for decreased lengths of the network cabling 232 (e.g., fiber optic or otherwise) between switches 230 and server racks 214, switches 230 and a connection at the data center 200 to an external network, and between server racks 214.

In some aspects, the example implementation of the data center 200 with separated (e.g., vertically) IT equipment layer 211 from networking layer 215 may also increase a deployment velocity of the data center equipment (e.g., server racks 214, networking switches 230) by separating networking routing paths (e.g., for the cabling 232) to enable easier incremental network turn ups, decommissions, and transformations. This may also improve accessibility for the network cabling 232. Such decoupling of the IT layer 211 and network layer 215 may also allow separate construction trades (e.g., electrical and cabling installation) to occur in parallel.

The frame assembly 210 comprises structural members (e.g., metal or non-metal, such as composite) arranged and connected to form multiple bays 212 in the frame assembly 210. Each bay 212, in this example implementation, defines a volume within the frame assembly 210 and may be the same or similar in volume and perimeter dimensions (e.g., height "H", width "W", and depth "D") as the other bays 212 in the layer 211 of the server rack assembly 210. In some aspects, H may be about 10 feet, W may be about 10 feet, and D may be about 3 feet, as an exemplary set of dimensions.

In some aspects, the perimeter dimensions of the bays 212 (and thus the volumes defined by the bays 212) in the frame assembly 210 are based on or associated with dimensions of the server racks 214. For example, in the illustrated implementations, each bay 212 is sized (e.g., at least W and H) according to dimensions of a double server rack 214 (i.e., two server racks of 42 U in height, two server racks of between 18-22 U in height, or other sized server racks). In some aspects, the server racks 214 may be 54 U in height, although frame assembly 210 may handle a variation of rack sizes. For example, the racks 214 may be about 50 inches wide each.

Furthermore, different combinations of racks 214 can be used in the example implementation. For an example, four racks 214, each 24 inches in width, can be used within the frame assembly 210. The racks 214 can also vary in depth. For example, the front faces of the server racks 214 may be flush with a front side 222 of the assembly 210, while a rear of the racks 214 may extend various depths beyond back sides 224 of the assembly 210.

As shown in FIG. 2A, the server racks 214 support electronic devices, such as processors, memory modules, networking switches, battery modules, and other server rack computing components, both physically by providing structure for the devices to be placed in and electrically by providing electric power to the devices from a main source of power (e.g., through an inverter, a transformer, or both). Generally, each illustrated server rack 214 may be one of a number of server racks within the data center building 202, which may include a server farm or a co-location facility that contains various rack mounted computer systems. Each server rack 214 may define multiple slots that are arranged in an orderly and repeating fashion within the server rack 214, and each slot is a space in the rack into which a corresponding server rack sub-assembly 218 can be placed and removed. For example, a server rack sub-assembly 218 can be supported on rails that project from opposite sides of the rack 214, and which can define the position of the slots. Also, although multiple server rack sub-assemblies 218 are illustrated as mounted within the rack 214, there might be only a single server rack sub-assembly.

The slots, and the server rack sub-assemblies 218, can be oriented with the illustrated horizontal arrangement (with respect to gravity) as shown in FIG. 2A. Alternatively, the slots, and the server rack sub-assemblies 218, can be oriented vertically (with respect to gravity). Where the slots are oriented horizontally, they may be stacked vertically in the rack 214, and where the slots are oriented vertically, they may be stacked horizontally in the rack 214.

Server rack 214, as part of a larger data center for instance, may provide data processing and storage capacity. In operation, a data center may be connected to a network, and may receive and respond to various requests from the network to retrieve, process, and/or store data. In operation, for example, the server rack 214 typically facilitates the communication of information over a network with user interfaces generated by web browser applications of users who request services provided by applications running on computers in the datacenter. For example, the server rack 214 may provide or help provide a user who is using a web browser to access web sites on the Internet or the World Wide Web.

The server rack sub-assembly 218 may be one of a variety of structures that can be mounted in a server rack 214. For example, in some implementations, the server rack sub-assembly 218 may be a "tray" or tray assembly that can be slideably inserted into the server rack 214. The term "tray" is not limited to any particular arrangement, but instead applies to motherboard or other relatively flat structures appurtenant to a motherboard for supporting the motherboard in position in a rack structure. In some implementations, the server rack sub-assembly 218 may be a server chassis, or server container (e.g., server box). In some implementations, the server rack sub-assembly 218 may be a hard drive cage.

Each server rack sub-assembly 218 can include a frame or cage, a printed circuit board, e.g., motherboard, supported on the frame, and one or more electronic devices 220, e.g., a processor or memory, mounted on the printed circuit board. The electronic devices 220 can include, for instance, processors, memories, hard drives, network switches, or other IT components. Other appurtenances, such as cooling devices, fans, uninterruptible power supplies (UPS) (e.g., battery modules), power conversion devices (e.g., from DC to DC, from DC to AC, from AC to DC) can be mounted to the server rack sub-assembly 218 (or otherwise to a rack 214).

With respect specifically to FIG. 2A, the cooling units 216 are positioned adjacent the server racks 214 in the bays 212. In some aspects, each cooling unit 216 may comprise a form factor (e.g., dimensions such as width and height) that is similar to or the same as a form factor (e.g., dimensions such as width and height) of the server racks 214. In some aspects, while a width and a height of the cooling units 216 are the same as or similar to the width and height, respectively, of the server racks 214, a depth of the cooling unit (e.g., as shown in FIG. 2B), may be different (e.g., larger) than a depth of the server racks 214. Thus, in some aspects, each cooling unit 216 may be positioned in any of the bays 212, and each server rack 214 may be positioned in any of the bays 212, thereby making the cooling units 216 and server racks 214 interchangeable within the frame assembly 210.

In some aspects, the cooling units 216 may be fluidly coupled to a source of the cooling liquid, such as a chiller plant, one or more evaporative cooling units (e.g., cooling towers), one or more condensing units (e.g., in the case of direct expansion cooling), a natural source of cooling liquid (e.g., lake, ocean, river, or other natural body of water), or a combination thereof. In some aspects, the cooling units 216 may be stand-alone refrigerant-based (DX) cooling units fluidly coupled to one or more condensing units located external to the data center building 202 (e.g., conventionally known as "CRAC" units).

As shown in more detail in FIG. 2B, a warm air aisle 218 is defined between adjacent rows 208 of server rack frame assemblies 210, with open back sides 224 of the server rack frame assemblies 210 facing the warm air aisle 218. Although only two rows 208 and one warm air aisle are shown in FIG. 2B, the data center building 202 may house multiple rows 208 with warm air aisles 218 defined between pairs of rows 208 of the server rack frame assemblies 210. In this example implementation, the open back sides 224 of the frame assemblies 210 allow for airflow with minimal or no pressure gradient between the backs of the server racks 214 (which are also open) that face the warm air aisle 218 and the warm air aisle 218 itself. Similarly, the server rack frame assemblies 210 have, in this example, open front sides 222 that face the cool air aisles 220. The open front sides 222 of the frame assemblies 210 allow for airflow with minimal or no pressure gradient between the fronts of the server racks 214 (which are also open) that face the cool air aisle 220 and the cool air aisle 220 itself. Thus, in some aspects, an air pressure at the fronts and backs of the server racks 214, which are open to the aisles 220 and 218, respectively, are substantially equal or equal to an air pressure within the aisles 220 and 218, respectively.

In operation, the cooling units 216 circulate a cooling airflow 228 through the front sides 222 of the server racks 214 (e.g., that are open to the human-occupiable workspace 204). The cooling airflow 228 receives heat from electronic devices 220 in the racks 214 and warms the airflow 228 to a heated airflow 226 that enters the warm air aisle 218. The heated airflow 226 is drawn back into the cooling units 216 (e.g., by fans in the units 216) and cooled through the one or more cooling coils (e.g., by a flow of the chilled liquid, condenser water, refrigerant, or an electrically-powered cooler such as a Peltier cooler). The cooled airflow 228 is circulated (e.g., by the fans) back into the human-occupiable workspace 204 adjacent the front sides 222 of the server racks 214 and server rack frame assemblies 210.

Figure 3A:
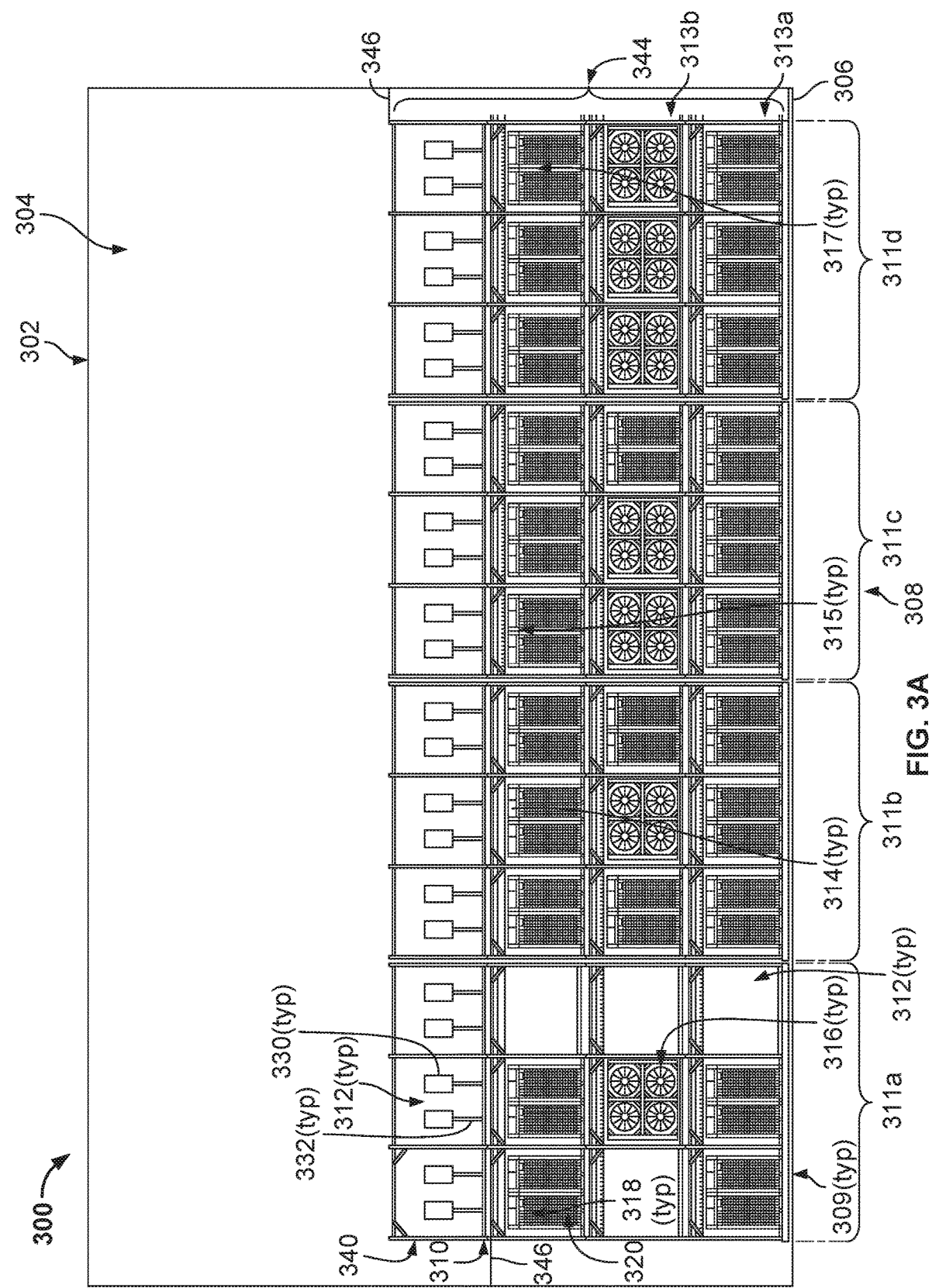
FIGS. 3A-3B are schematic illustrations of a side and end view, respectively, of another example implementation of a data center system that includes multiple IT equipment layers and a networking switch layer according to the present disclosure.
Figure 3B:
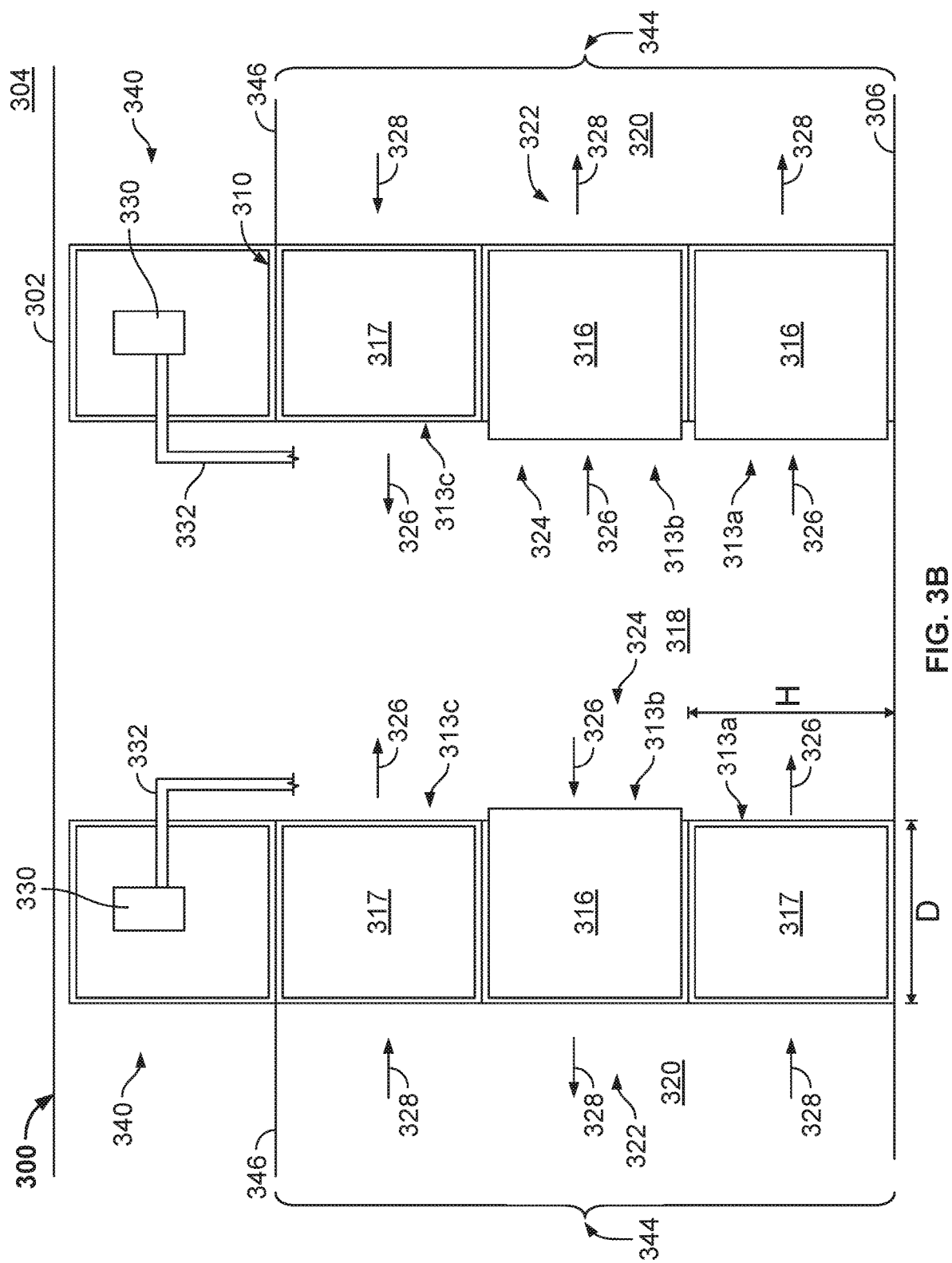

FIGS. 3A-3B are schematic illustrations of a side and end view, respectively, of another example implementation of a data center system 300 that includes multiple, stacked and mixed computing and cooling layers 313a-313c (collectively, an IT layer 344), positioned below a networking layer 340, positioned in a human-occupiable workspace 304 of a data center building 302. As shown in this example implementation, the data center system 300 includes three layers 313a-313c of server racks 314 (or server racks 315 or server racks 317) and cooling units 316, as well as networking switches 330 positioned in the networking layer 340. The server racks 314 (and 315 and 317) and network switches 330 are positioned in a frame assembly 342. In this example, the layers 313a-313c and networking layer 340 are arranged in a row 308 (e.g., linear or substantially linear arrangement of the frame assembly 342). In alternative arrangements, the layers 313a-313c and networking layer 340 may be arranged in a non-linear frame assembly, such as, for instance, a circular or partially circular frame assembly or otherwise. Although three layers 313a-313c are shown in this example, fewer (e.g., two) or more layers may be implemented without departing from the scope of the present disclosure. Regardless of the number of server rack, or IT equipment, layers 313a-313c, in some aspects, a single networking layer 340 may be positioned in the frame assembly 342 above the IT layers 344.

As shown in FIGS. 3A-3B, the networking layer 340 is positioned on top of the IT computing layers 313a-313c (and specifically, 313c). In this example implementation, the networking layer 340 may be positioned on or include a support surface 346 that is positioned between the top computing layer 313c and the networking layer 340. The support surface 346, in some aspects, may be a raised support surface, such as a mezzanine (e.g., with grated walking surfaces) from which a human operator may traverse and, e.g., service the networking switches 330 or the illustrated networking cabling 332. In some aspects, the mezzanine may be further supported by a data center floor 306 (e.g., slab, raised floor, or other surface) and/or one or more walls of the data center building 302. Thus, in some aspects, the support surface 346 may be a human-occupiable and traversable surface that is supported by, but not considered a part of, the data center building 302.

In alternative aspects, the support surface 346 may be part of or comprise a floor of the data center building 302 (e.g., a second floor, third floor, or otherwise). For example, the support surface 346 may be or include a cement slab that can support, e.g., the networking layer 340, and one or more humans or machines that may service the networking switches 330.

In this example, the networking layer 340 include network switches 330 (e.g., stage 2 switches) positioned within bays 312 of the frame assembly 310 and connected, via network cabling 332 (e.g., fiber optic or otherwise) to the server racks 314 (and 315 and 317) in IT layers 344 (e.g., one or more devices in the server racks). For example, in some aspects, particular network switches 330 in a particular bay 312 of layer 340 may be coupled via the network cabling 332 to server racks 314 (or 315 or 317) that are located in a particular bay 312 of IT layer 344 that is directly below (e.g., vertically) the particular bay 312 of layer 340. In some aspects, particular network switches 330 in a particular bay 312 of layer 340 may be coupled via the network cabling 332 to server racks 314 (or 315 or 317) that are located in a particular bay 312 of IT layer 344 that is indirectly below (e.g., vertically below and horizontally offset by one bay 312) the particular bay 312 of layer 340. Even further, in some aspects, particular network switches 330 in a particular bay 312 of layer 340 may be coupled via the network cabling 332 to server racks 314 (or 315 or 317) that are located in a particular bay 312 of IT layer 344 that is indirectly below (e.g., vertically below and horizontally offset by more than one bay 312) the particular bay 312 of layer 340. In short, networking switches 330 may be connected via the cabling 332 to server racks 314 (and 315 and 317) that are vertically below, as well as vertically below and offset.

As shown in FIGS. 3A-3B, the networking cabling 332, and thus the communication connections between server racks 314, 315, and 317 (e.g., through the network switches 330), between server racks 314 (and 315 and 317) and a network external to the data center 300 (e.g., through network switches 330), and between network switches 330 (e.g., through server racks 314, 315, 317, or from/to an external network), are largely unimpeded by, e.g., cooling infrastructure, such as cooling units 316, ductwork, piping, electrical cabling, or other cooling equipment, due to the positioning of the network switches 330 in the layer 340. By mounting the networking layer 340 vertically above (or, possibly, vertically below in a sub-floor, basement, or other level below the data center floor 306) the IT equipment layers 313a-313c, the Z, or vertical, dimension of the human-occupiable workspace 304 may be taken advantage of as opposed to conventional data centers. This may also provide for decreased lengths of the network cabling 332 (e.g., fiber optic or otherwise) between switches 330 and server racks 314 (and 315 and 317), switches 330 and a connection at the data center 300 to an external network, and between server racks 314 (and 315 and 317).

In some aspects, the example implementation of the data center 300 with separated (e.g., vertically) IT equipment layer 344 from networking layer 340 may also increase a deployment velocity of the data center equipment (e.g., server racks 314, 315, and 317, networking switches 330) by separating networking routing paths (e.g., for the cabling 332) to enable easier incremental network turn ups, decommissions, and transformations. This may also improve accessibility for the network cabling 332. Such decoupling of the IT layer 344 and network layer 340 may also allow separate construction trades (e.g., electrical and cabling installation) to occur in parallel.

The frame assembly 310 comprises structural members (e.g., metal or non-metal, such as composite) arranged and connected to form multiple bays 312 in the frame assembly 310. Each bay 312, in this example implementation, defines a volume within the frame assembly 310 and may be the same or similar in volume and perimeter dimensions (e.g., height "H" of 10 feet, width "W" of 10 feet, and depth "D" of 3 feet) as the other bays 312 in the layer 313 of the frame assembly 310. In some aspects, the perimeter dimensions of the bays 312 (and thus the volumes defined by the bays 312) in the frame assembly 310 are based on or associated with dimensions of the server racks 314 (or 315 or 317). For example, in the illustrated implementations, each bay 312 is sized (e.g., at least 10' W and 10' H) according to dimensions of a double server rack 314 (or 315 or 317) (i.e., two server racks of 42 U in height, two server racks of between 18-22 U in height, or other sized server racks). In some aspects, the server racks 314 (or 315 or 317) may be 54 U in height, although frame assembly 310 may handle a variation of rack sizes. For example, the racks 314 (or 315 or 317) may be about 50 inches wide each.

Furthermore, different combinations of racks 314 (or 315 or 317) can be used in the example implementation. For an example, four racks 314 (or 315 or 317), each 24 inches in width, can be used within the frame assembly 310. The racks 314 (or 315 or 317) can also vary in depth. For example, the front faces of the server racks 314 (or 315 or 317) may be flush with a front sides of the assembly 310, while a rear of the racks 314 (or 315 or 317) may extend various depths beyond back sides of the assembly 310.

As shown in FIG. 3A, groups of bays 312 may be arranged to form columns 309 (e.g., a vertical group of three stacked bays 312). The bays 312 may be further grouped, in this example, in clusters 311a-311d of bays 312 that include a multi-dimensional (e.g., vertical and horizontal) grouping of bays 312. In this example implementation, clusters 311a-311d are shown as three by three (e.g., three columns 309 of bays 312 by three layers 313 of bays 312) groupings of nine total bays 312. In some aspects, a column 309 or cluster 311 of bays 312 may be part of a power, cooling liquid, or network sharing architecture. For example, in some aspects, separate electrical power conductors may provide electrical power to the server racks 314 (or 315 or 317) and cooling units 316 that are positioned in separate columns 309 or clusters 311 of bays 312, e.g., to ensure that a failure of one power conductor only affects the racks 314 (or 315 or 317) and/or cooling units 316 in that particular column 309 or cluster 311. Likewise, in some aspects, separate cooling liquid conduits may provide a cooling liquid to the cooling units 316 that are positioned in separate columns 309 or clusters 311 of bays 312, e.g., to ensure that a failure of one cooling liquid conduit only affects the cooling units 316 in that particular column 309 or cluster 311. Further, in some aspects, separate networking connectors may provide data communication to the server racks 314 (or 315 or 317) that are positioned in separate columns 309 or clusters 311 of bays 312, e.g., to ensure that a failure of one network connector only affects the racks 314 (or 315 or 317) in that particular column 309 or cluster 311.

As shown in FIG. 3A, the server racks 314 (or 315 or 317) support electronic devices, such as processors, memory modules, networking switches, battery modules, and other server rack computing components, both physically by providing structure for the devices to be placed in and electrically by providing electric power to the devices from a main source of power (e.g., through an inverter, a transformer, or both). Generally, each illustrated server rack 314 (or 315 or 317) may be one of a number of server racks within the data center building 302, which may include a server farm or a co-location facility that contains various rack mounted computer systems. Each server rack 314 (or 315 or 317) may define multiple slots that are arranged in an orderly and repeating fashion within the server rack 314 (or 315 or 317), and each slot is a space in the rack into which a corresponding server rack sub-assembly 318 can be placed and removed. For example, a server rack sub-assembly 318 can be supported on rails that project from opposite sides of the rack 314 (or 315 or 317), and which can define the position of the slots. Also, although multiple server rack sub-assemblies 318 are illustrated as mounted within the rack 314 (or 315 or 317), there might be only a single server rack sub-assembly.

The slots, and the server rack sub-assemblies 318, can be oriented with the illustrated horizontal arrangement (with respect to gravity) as shown in FIG. 3A. Alternatively, the slots, and the server rack sub-assemblies 318, can be oriented vertically (with respect to gravity). Where the slots are oriented horizontally, they may be stacked vertically in the rack 314 (or 315 or 317), and where the slots are oriented vertically, they may be stacked horizontally in the rack 314 (or 315 or 317).

Server rack 314 (or 315 or 317), as part of a larger data center for instance, may provide data processing and storage capacity. In operation, a data center may be connected to a network, and may receive and respond to various requests from the network to retrieve, process, and/or store data. In operation, for example, the server rack 314 (or 315 or 317) typically facilitates the communication of information over a network with user interfaces generated by web browser applications of users who request services provided by applications running on computers in the datacenter. For example, the server rack 314 (or 315 or 317) may provide or help provide a user who is using a web browser to access web sites on the Internet or the World Wide Web.

The server rack sub-assembly 318 may be one of a variety of structures that can be mounted in a server rack 314 (or 315 or 317). For example, in some implementations, the server rack sub-assembly 318 may be a "tray" or tray assembly that can be slideably inserted into the server rack 314 (or 315 or 317). The term "tray" is not limited to any particular arrangement, but instead applies to motherboard or other relatively flat structures appurtenant to a motherboard for supporting the motherboard in position in a rack structure. In some implementations, the server rack sub-assembly 318 may be a server chassis, or server container (e.g., server box). In some implementations, the server rack sub-assembly 318 may be a hard drive cage.

Each server rack sub-assembly 318 can include a frame or cage, a printed circuit board, e.g., motherboard, supported on the frame, and one or more electronic devices 320, e.g., a processor or memory, mounted on the printed circuit board. The electronic devices 320 can include, for instance, processors, memories, hard drives, network switches, or other IT components. Other appurtenances, such as cooling devices, fans, uninterruptible power supplies (UPS) (e.g., battery modules), power conversion devices (e.g., from DC to DC, from DC to AC, from AC to DC) can be mounted to the server rack sub-assembly 318 (or otherwise to a rack 314 (or 315 or 317)).

Server racks 314, server racks 315, and server racks 317, as shown, may be physically similar or identical (e.g., similar or identical height, width, depth, weight), but may provide different computing power and, thus, different heat output. For example, server racks 314 may be 15 kW racks, with electronic devices 320 that generate about 15 kW of heat each. Server racks 315 may be 30 kW racks, with electronic devices 320 that generate about 30 kW of heat each. Server racks 317 may be 100 kW racks, with electronic devices 320 that generate about 100 kW of heat each. Thus, in some aspects, a number and computing power of the particular racks (e.g., server racks 314, 315, and/or 317) within a particular layer 313a-313c, a particular column 309, or a particular cluster 311a-311d of bays 312 may dictate a number of cooling units 316 that are positioned within the particular layer 313a-313c, particular column 309, or particular cluster 311a-311d of bays 312. For example, the greater number of server racks 317 relative to server racks 314 within any particular layer, column, or cluster may dictate (e.g., due to cooling requirements for the heat generated by the electronic devices 320 in the racks) a greater number of cooling units 316 within the particular layer, column, or cluster. Conversely, the greater number of server racks 314 relative to server racks 317 within any particular layer, column, or cluster may dictate (e.g., due to cooling requirements for the heat generated by the electronic devices 320 in the racks) a fewer number of cooling units 316 within the particular layer, column, or cluster.

In some aspects, each particular layer, column, or cluster (or other sub-unit of the frame assembly 310) may be reconfigured over an operating lifetime of the data center system 300. For example, reconfiguration may include moving particular server racks 314 (or 315 or 317) from particular bays 312 to other bays 312. In such reconfigurations, a number of cooling units 316 may not change, but such cooling units 316 may also be moved from particular bays 312 to other bays 312 (e.g., to account for movement of heat sources from one location to another location). Reconfigurations may also include replacing server racks 314 with higher power server racks 315 or 317 within particular bays 312. In such reconfigurations, a number of cooling units 316 may increase (e.g., to account for additional heat generated by the higher power racks 315 or 317) within a particular layer, column, or cluster. Reconfigurations may also include replacing server racks 317 with lower power server racks 315 or 314 within particular bays 312. In such reconfigurations, a number of cooling units 316 may decrease (e.g., to account for less heat generated by the lower power racks 315 or 314) within a particular layer, column, or cluster. Reconfigurations may also include removing server racks 314 (or 315 or 317) from particular bays 312. In such reconfigurations, a number of cooling units 316 may decrease (e.g., to account for less heat generated) within a particular layer, column, or cluster. In such reconfigurations, for example, when a particular bay 312 does not include any server rack 314 (or 315 or 317) or cooling unit 316, a blank-off panel (e.g., sheet metal or otherwise) may be installed across a width and height of the bay 312 to prevent airflow from being circulated through the empty bay 312.

While FIG. 3A shows the clusters 311a-311d within a single row 308 of the frame assembly 310, each cluster 311 may represent a particular configuration at a particular operating time of the data center system 300 for illustrative purposes. For example, cluster 311a may represent a configuration at an initial operating time of the system 300, with only four server racks 314 and one cooling unit 316 within the nine total bays 312 of the cluster 311a. At the initial operating time, only a single cooling unit 316 may be needed to remove the heat generated by the four server racks 314. Empty bays 312 may include blank-off panels as previously described.

Cluster 311b may represent a configuration at a later operating time of the system 300, with eight server racks 314 and one cooling unit 316 within the nine total bays 312 of the cluster 311b. At the later operating time, still only a single cooling unit 316 may be needed to remove the heat generated by the eight server racks 314. In this configuration, no bays 312 are empty.

Cluster 311c may represent a configuration at another later operating time of the system 300, with seven server racks 315 and two cooling units 316 within the nine total bays 312 of the cluster 311c. At this later operating time, two single cooling units 316 may be needed to remove the heat generated by the seven server racks 315, which, as described, may have more computing power and thus generate more heat than the server racks 314, and thus require additional cooling power (through the additional cooling units 316) to remove the generated heat.

Cluster 311d may represent a configuration at still another later operating time of the system 300, with six server racks 317 and three cooling units 316 within the nine total bays 312 of the cluster 311d. At this later operating time, three single cooling units 316 may be needed to remove the heat generated by the six server racks 317, which, as described, may have more computing power and thus generate more heat than the server racks 314 and 315 and thus require additional cooling power (through the additional cooling units 316) to remove the generated heat.

With respect specifically to FIG. 3A, the cooling units 316 are positioned adjacent the server racks 314 (or 315 or 317) in the bays 312. In some aspects, each cooling unit 316 may comprise a form factor (e.g., dimensions such as width and height) that is similar to or the same as a form factor (e.g., dimensions such as width and height) of the server racks 314 (or 315 or 317). In some aspects, while a width and a height of the cooling units 316 are the same as or similar to the width and height, respectively, of the server racks 314 (or 315 or 317), a depth of the cooling unit (e.g., as shown in FIG. 3B), may be different (e.g., larger) than a depth of the server racks 314 (or 315 or 317). Thus, in some aspects, each cooling unit 316 may be positioned in any of the bays 312, and each server rack 314 (or 315 or 317) may be positioned in any of the bays 312, thereby making the cooling units 316 and server racks 314 (or 315 or 317) interchangeable within the frame assembly 310.

In some aspects, the cooling units 316 may be fluidly coupled to a source of the cooling liquid, such as a chiller plant, one or more evaporative cooling units (e.g., cooling towers), one or more condensing units (e.g., in the case of direct expansion cooling), a natural source of cooling liquid (e.g., lake, ocean, river, or other natural body of water), or a combination thereof. In some aspects, the cooling units 316 may be stand-alone refrigerant-based (DX) cooling units fluidly coupled to one or more condensing units located external to the data center building 302 (e.g., conventionally known as "CRAG" units).

As shown in more detail in FIG. 3B, a warm air aisle 318 is defined between adjacent rows 308 of server rack frame assemblies 310, with open back sides 324 of the server rack frame assemblies 310 facing the warm air aisle 318. Although only two rows 308 and one warm air aisle are shown in FIG. 3B, the data center building 302 may house multiple rows 308 with warm air aisles 318 defined between pairs of rows 308 of the server rack frame assemblies 310. In this example implementation, the open back sides 324 of the frame assemblies 310 allow for airflow with minimal or no pressure gradient between the backs of the server racks 314 (or 315 or 317) (which are also open) that face the warm air aisle 318 and the warm air aisle 318 itself. Similarly, the server rack frame assemblies 310 have, in this example, open front sides 322 that face the cool air aisles 320. The open front sides 322 of the frame assemblies 310 allow for airflow with minimal or no pressure gradient between the fronts of the server racks 314 (or 315 or 317) (which are also open) that face the cool air aisle 320 and the cool air aisle 320 itself. Thus, in some aspects, an air pressure at the fronts and backs of the server racks 314 (or 315 or 317), which are open to the aisles 320 and 318, respectively, are substantially equal or equal to an air pressure within the aisles 320 and 318, respectively.

In operation, the cooling units 316 circulate a cooling airflow 328 through the front sides 322 of the server racks 314 (or 315 or 317) (e.g., that are open to the human-occupiable workspace 304). The cooling airflow 328 receives heat from electronic devices 320 in the racks 314 (or 315 or 317) and warms the airflow 328 to a heated airflow 326 that enters the warm air aisle 318. The heated airflow 326 is drawn back into the cooling units 316 (e.g., by fans in the units 316) and cooled through the one or more cooling coils (e.g., by a flow of the chilled liquid, condenser water, refrigerant, or an electrically-powered cooler such as a Peltier cooler). The cooled airflow 328 is circulated (e.g., by the fans) back into the human-occupiable workspace 304 adjacent the front sides 322 of the server racks 314 (or 315 or 317) and server rack frame assemblies 310.

Figure 4A:
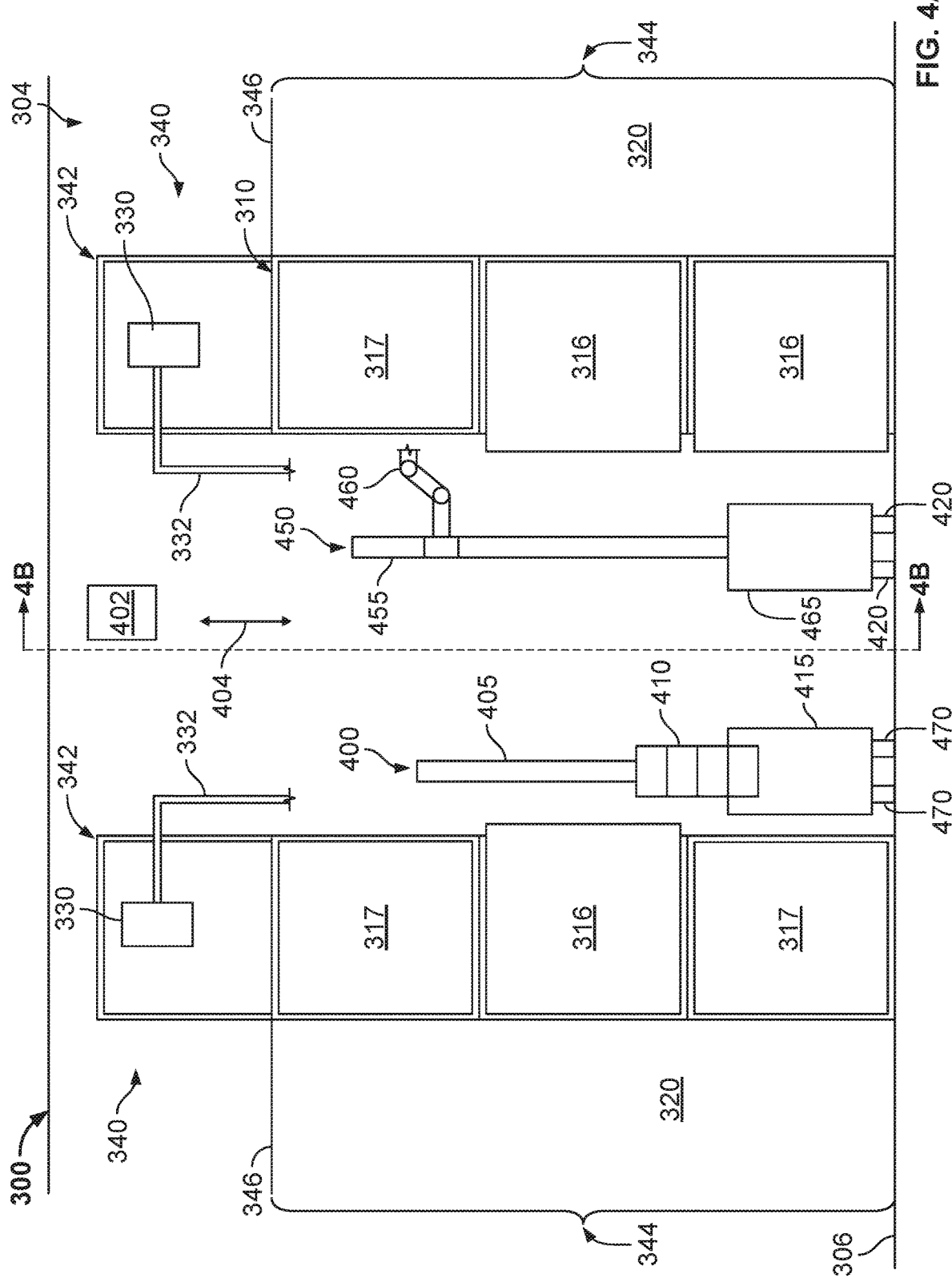
FIGS. 4A-4B are schematic illustrations of a side and back view, respectively, of an example implementation of a data center system that includes an automatic servicing machine according to the present disclosure.
Figure 4B:
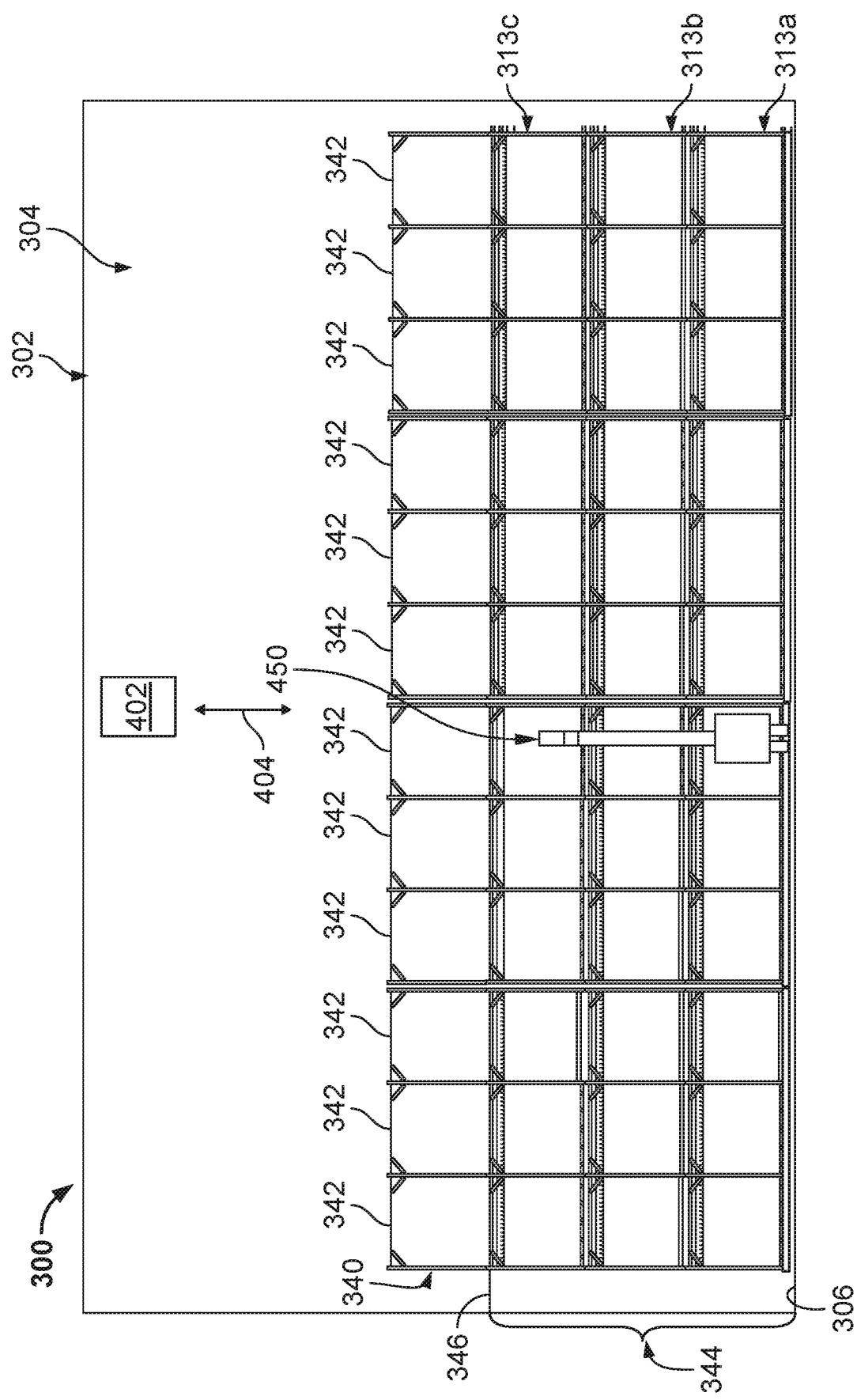

FIGS. 4A-4B are schematic illustrations of a side and back view, respectively, of an example implementation of a data center system, e.g., for data center 300, that includes one or more automatic servicing machines, such as the illustrated automated service machines 400 and 450. Generally, each of the automated service machines 400 and 450 may be operated, controlled, programmed, or pre-programmed to perform one or more tasks related to deployment, servicing, or replacement of IT equipment, such as server rack-sub-assemblies 318 or electronic devices 320 or networking equipment, such as networking switches 330. Although the automated service machines 400 and 450 are illustrated in the context of the data center 300, such machines 400 and 450 according to the present disclosure may also be utilized, e.g., in data center 100, data center 200, or another data center according to the present disclosure (e.g., a data center with a layered, stacked structure of IT equipment and networking equipment).

The illustrated example includes an automated service machine 400 and an automated service machine 450 within the data center 300. Generally, automated service machine 400 represents a human-operated (e.g., human on-board) automated service machine (e.g., a lift truck, forklift, or otherwise), and includes a motor 415 (e.g., electric, propane, gasoline, or otherwise) mounted on rollers 420 (e.g., wheels, sliders, rail wheels). The automated service machine 400 also includes a support basket 410 in which a human-operator may ride while, for example, operating the automated service machine 400. A mast 405 is mounted to the motor 415 and provides a height-adjustment mechanism for the basket 410 (which may vertically move up and down the mast 405 to adjust the height of the basket 410 relative to the data center floor 306). Although the rollers 420 are shown as contacting the data center floor 306, in alternative implementations, the rollers 420 may engage one or more tracks (or slots) attached to (or formed in) the data center floor 306. In some aspects, the tracks (not shown here) may be arranged to run along one or both sides (front and/or back sides) of one or more rows of the layers 344 and 340 in the data center 300.

Generally, automated service machine 450 represents a human or computer-controlled (e.g., no human on-board) automated service machine, and includes a motor 465 (e.g., electric, propane, gasoline, or otherwise) mounted on rollers 470 (e.g., wheels, sliders, rail wheels). The automated service machine 450 also includes a mast 455 that is mounted to the motor 465 and provides a height-adjustment mechanism for an extendable end effect 460 (e.g., claw, pincher, forks, magnetized end, etc.), which may vertically move up and down the mast 455 to adjust the height of the end effect 460 relative to the data center floor 306. Although the rollers 470 are shown as contacting the data center floor 306, in alternative implementations, the rollers 470 may engage one or more tracks (or slots) attached to (or formed in) the data center floor 306. In some aspects, the tracks (not shown here) may be arranged to run along one or both sides (front and/or back sides) of one or more rows of the layers 344 and 340 in the data center 300.

In some aspects, one or both of the automated service machines 400 and 450 may at least partially be controlled by a control system 402, through one or more wireless (or wired) signals 404. The control system 402, in some aspects, may be a micro-processor based control system, such as a building automation system or otherwise. In any event, whether controlled solely by a human operator on board, such as for automated service machine 400, or with or by control system 402 (which may be on board the automated service machine 400 or 450), such as for automated service machine 450, each of the automated service machines 400 and 450 may perform one or more of the following operations.

For example, the automated service machines 400 and 450 may be moved through the data center 300 adjacent any of the bays 312 of the frame assembly 310, whether in IT layers 344 or networking layer 340. The movement of the automated service machines 400 and 450 can be between rows of the frame assemblies 310 (and layers 344 and 340) or otherwise within a human-occupiable workspace of the data center 300. In some aspects, the automated service machines 400 and 450 may be moved through the data center 300 adjacent any of the bays 312 of the frame assembly 310 based on an indication by one or more of the server rack-sub-assemblies 318, electronic devices 320 or networking switches 330, of a malfunction or need for replacement. In some aspects, the automated service machines 400 and 450 may be moved through the data center 300 adjacent any of the bays 312 of the frame assembly 310 based on a pre-determined periodic maintenance of one or more of the server rack-sub-assemblies 318, electronic devices 320 or networking switches 330.

Once the automated service machines 400 and 450 are moved into a particular place in the data center 300 (e.g., adjacent a particular bay 312 of the frame assembly 310), the automated service machines 400 and 450 may be controlled or operated to perform a deployment, servicing, or replacement function, among others. For example, if a particular component such as a server rack-sub-assembly 318, electronic device 320, or networking switch 330 needs to be deployed, serviced, or replaced, a location within the data center 300 of the component (three dimensional location, including height from the data center floor 306) may be determined (e.g., by the control system 402, a human-operator on board controlling one of the automated service machines 400 or 450, or otherwise). For example, the control system 402 may determine a particular location (e.g., in three-dimensional space) of each component in the human-occupiable workspace 304 of the data center building 302 (e.g., with a GPS receiver positioned at or near each of the server rack sub-assemblies 318 or server racks 314, a pre-determined mapping of each of the server rack sub-assemblies 318 or server racks 314 to their associated locations, or otherwise).

If, for instance, the determined three-dimensional location of the particular component (e.g., to be deployed, serviced, replaced, or otherwise) is above (e.g., in a Z, or height, direction) than is reachable by a human standing on the data center floor 306, then the automated service machines 400 and 450 may be operated or moved to raise the particular component to the appropriate height. For example, the support basket 410 of automated service machine 400 may be adjusted (e.g., vertically on the mast 405) to raise a human-operator within the basket 410 to a particular height above the data center floor 306 to, e.g., deploy, service, or replace the particular component. The end effect 460 (which may hold or otherwise be connected to the particular component) of automated service machine 450 may be adjusted (e.g., vertically on the mast 455 and/or horizontally from the mast 455) to raise the particular component supported or held by the end effect 460 to a particular height above the data center floor 306 to, e.g., deploy, service, or replace the particular component.

Other operations may be performed by the automated services machines 400 and 450. For example, the automated service machines 400 and 450 can also be used to deploy non-IT equipment as well, such as air baffles or shelving that may be needed in an area or during a reconfiguration. The machines 400 and 450 may also deploy power conversion and batteries as well. For example, the automated machines 400 and 450 can also plug in and power up a rack, as well as move and reconfigure a rack (e.g., a server rack).

Figure 5A:
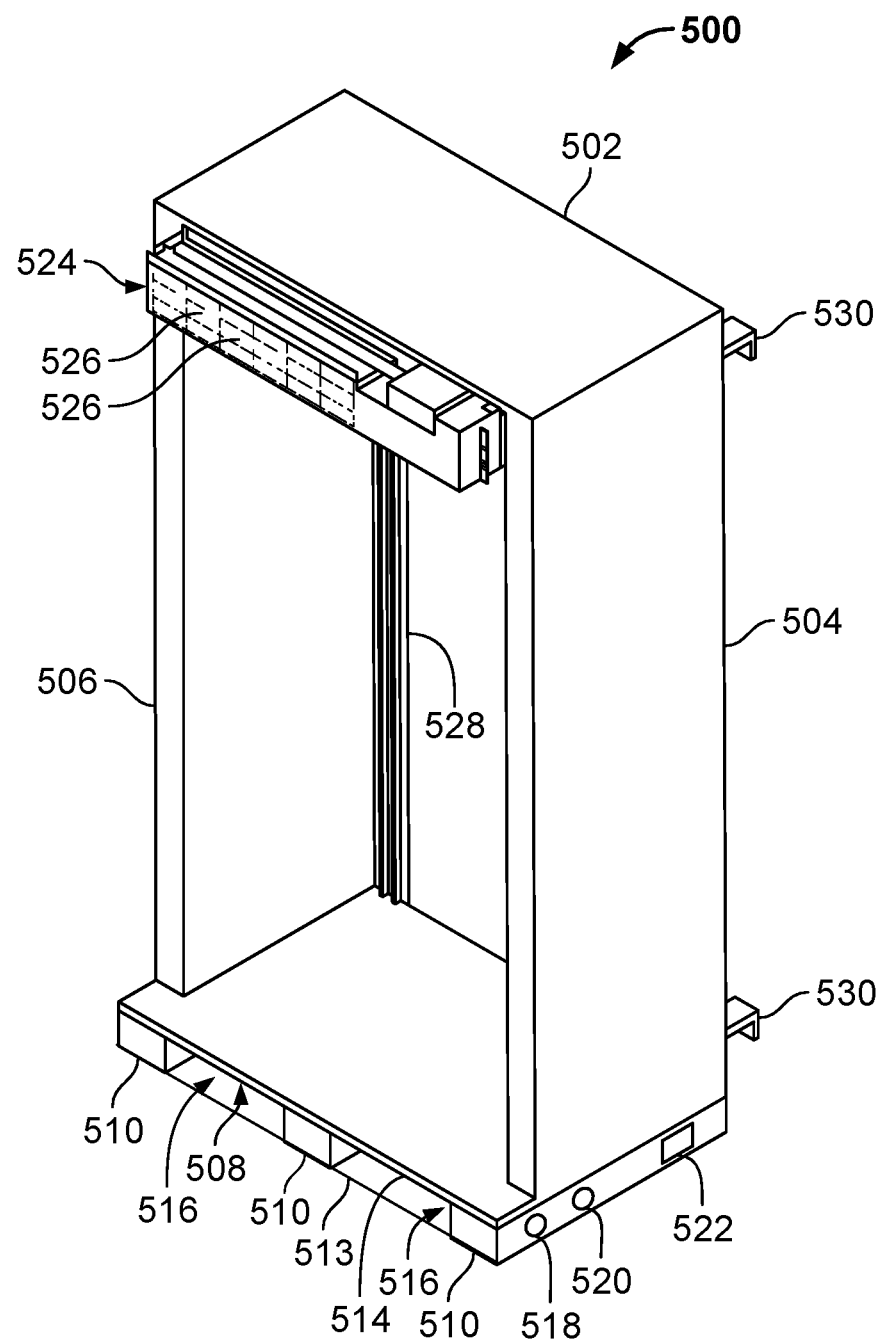
FIGS. 5A-5D are schematic illustrations of an example implementation of a data center rack system according to the present disclosure.
Figure 5B:
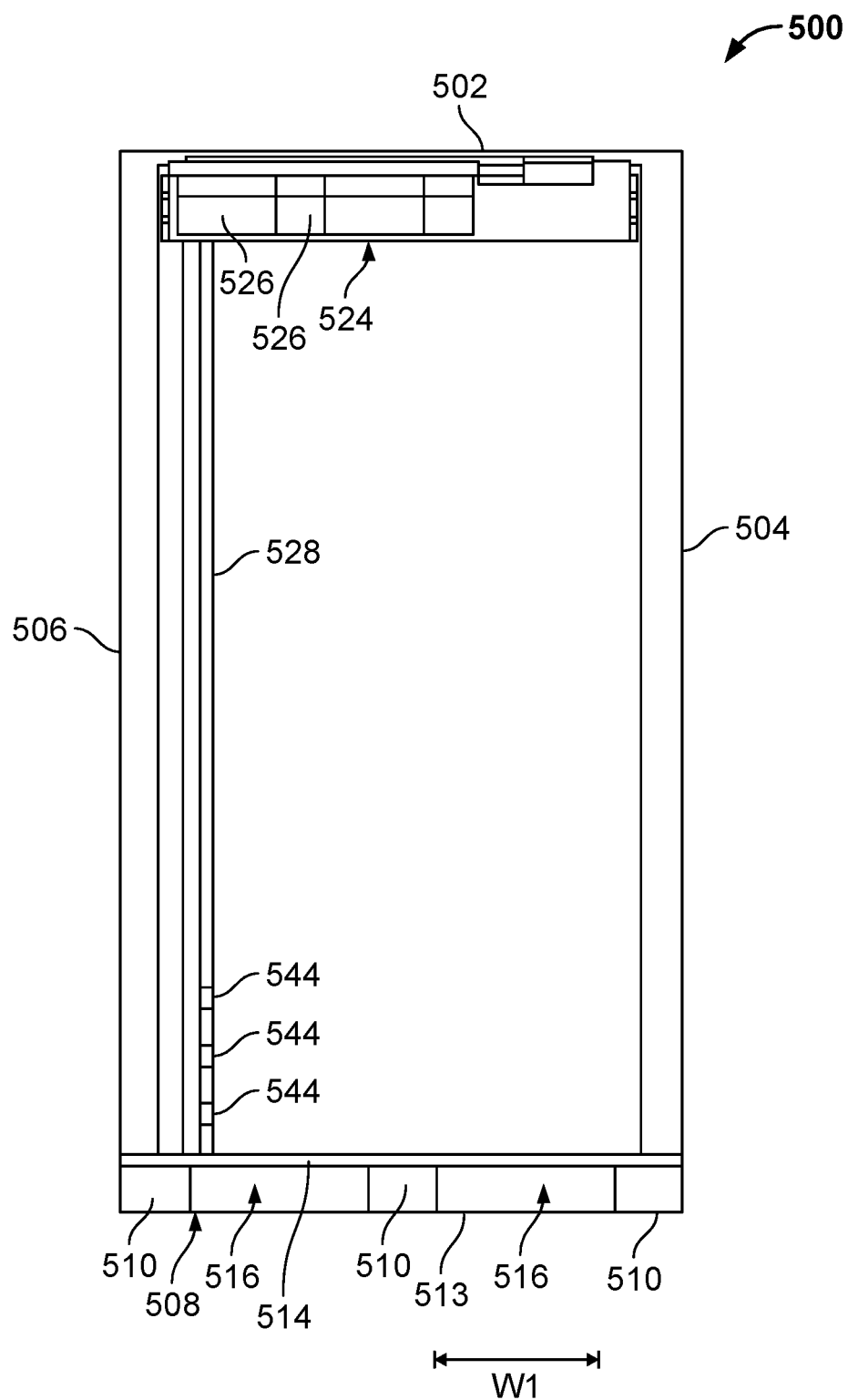
Figures 5C, 5D:
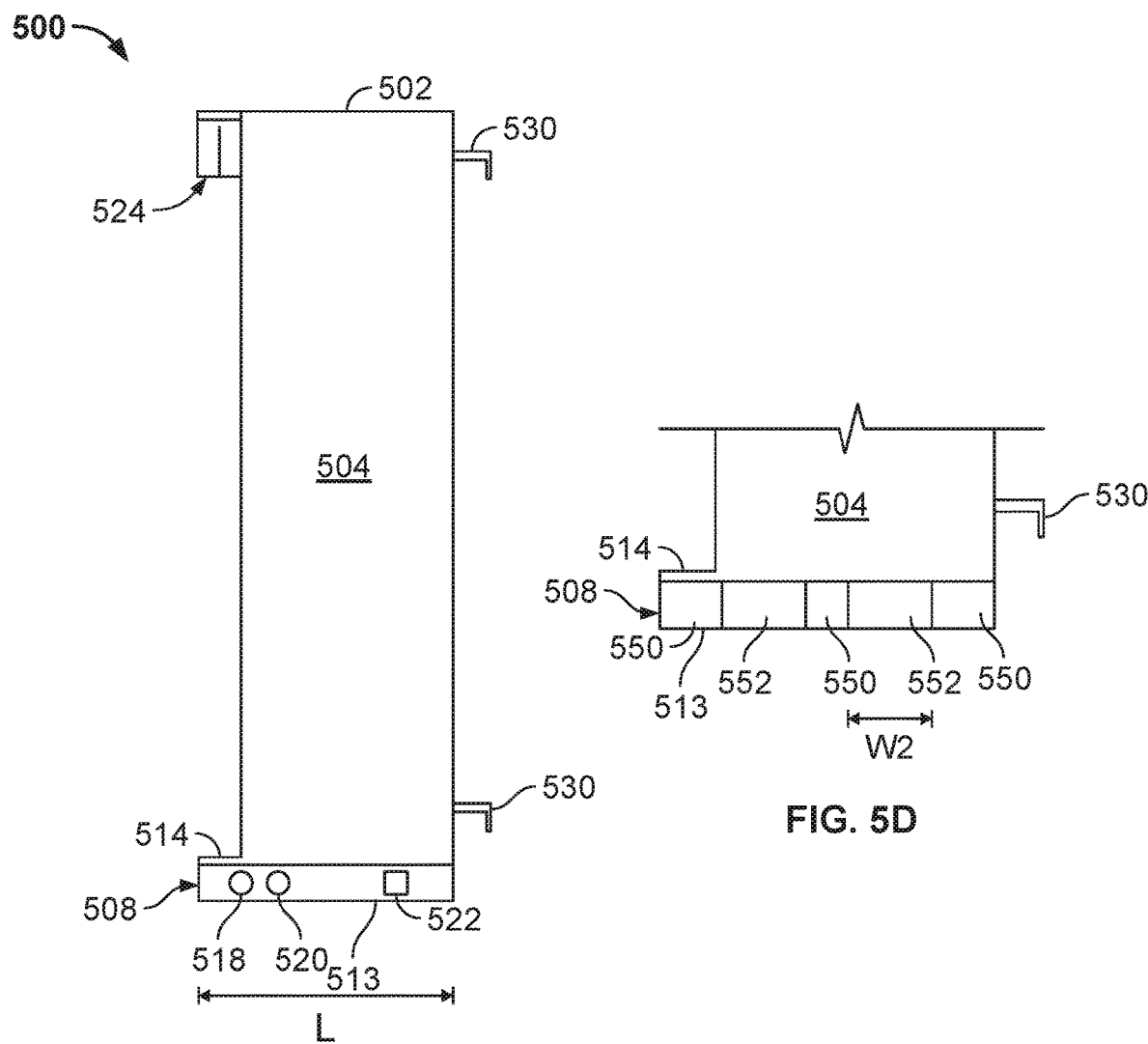

FIGS. 5A-5C are schematic illustrations of an example implementation of a data center rack system 500, that can support, for example, server trays, blade servers, memory devices, processors, networking switches and devices, and other IT equipment typically associated with a data center. The data center rack system 500, in some aspects, includes an integrally formed pallet portion with a server rack portion. In some implementations, any of server racks 214, 314, 315, or 317, or other server racks deployable within any of data center (or data center systems) 100, 200, or 300 may be a data center rack system 500 as shown in the example illustrations.

FIG. 5A shows an isometric view of an example implementation of the data center rack system 500; FIG. 5B shows a front view of the example implementation of the data center rack system 500; FIG. 5C shows a side view of the example implementation of the data center rack system 500; FIG. 5D shows a side view of a bottom portion of another example implementation of a data center rack system 500. As shown, an example implementation of a data center server tray 524 is installed within a volume of the data center rack system 500. The server tray 524 includes and supports (e.g., physically, electrically, with a network) one or more heat generating electronic devices 526, such as servers and their components: processors, memories, switches, power supplies, batteries, UPS, inverters, transformers, and other components. Although only a single server tray 524 is shown, multiple server trays 524, including enough to fill the volume of the data center rack system 500, are typically mounted within the system 500 for deployment in a data center.

Turning to FIGS. 5A-5C, the data center rack system 500 includes a top panel 502 coupled to side panels 504 (on the right, facing an open front face of the system 500) and 506 (on the left, facing the open front face). A bottom panel 514 of a rack bottom 508 is also coupled to the side panels 504 and 506. In the present disclosure, a "panel" may be a solid (e.g., non-perforated) and substantially (e.g., within millimeters) planar member that is formed or made from a metal or other material. In some aspects, the panels may include some perforations sized to, for example, allow a cooling airflow to circulate into a volume of the rack system 500 defined between the side panels 504 and 506 (horizontally) and between the bottom panel 514 and top panel 502 (vertically). In some aspects, any perforations in one or more of the described panels may be sized so as to prevent electrical or cellular interference (e.g., sized to limit wavelength interference) from an environment external to the data center rack system 500. Further, in some aspects, a panel may include a break or formed angle thereacross to increase strength of the panel.

In some aspects, panels that are part of the data center rack system 500 may be coupled together at adjoining edges by mechanical fasteners, such as screws, rivets, bolts, or alternatively may be mechanically joined by interlocking folds. In some aspects, the panels that are part of the data center rack system 500 may be integrally formed, such as welded or brazed together at edge, or attached through an adhesive. In other aspects, the panels may be integrally formed in that a single panel member may form two or more of the top panel 502, side panels 504 and 506, and bottom panel 514. For example, a planar member may be placed on a mechanical break to create angled (e.g., ninety degree) turns in the member. Thus, for example, in an example embodiment, the top, side, and bottom panels (502, 504, 506, and 514) may be formed from a single panel member, with a single weld, braze, or adhesion (or mechanical fastener) used to connect two end edges of the panel.

Although not shown in the figures, one or more structural members may be part of the housing of the data center rack system 500 that includes the panels 502, 504, 506, and 514. For example, in some aspects, one or more vertical, horizontal, or vertical cross-members may be attached to one or more of the panels 502, 504, 506, and 514. In some aspects, structural members may include vertical structural members (e.g., I or C channel) that are positioned along vertical edges of the side panels 504 and 506 and extending between the bottom panel 514 and the top panel 502. Thus, in some aspects, the panels 502, 504, 506, and 514 may be coupled to (e.g., welded, brazed, or otherwise attached) structural members to form the housing of the data center rack system 500.

As shown in FIGS. 5A-5B, the rack bottom 508 includes blocks 510 that extend beneath the bottom panel 514 and, in this example, from a front edge of the bottom panel 514 to a back edge of the bottom panel 514. In the isometric view of FIG. 5A, the front edge of the bottom panel 514 is directed out of the page (and also shown in FIG. 5B) while the back edge of the bottom panel 514 is directed into the page (and not visible in FIG. 5B). As shown in FIG. 5A, the data center rack system 500 comprises an "open" rack in that both the front face (e.g., the vertically planar opening adjacent the front edges of the side panels 504 and 506, top panel 502, and bottom panel 514), as well as the back face (e.g., the vertically planar opening adjacent the back edges of the side panels 504 and 506, top panel 502, and bottom panel 514) are open, such as to a human-occupiable workspace or volume of a data center building.

As shown in FIGS. 5A-5B, the blocks 510 are positioned under the bottom panel 514 to define lift slots 516, which are defined openings bounded on sides by adjacent blocks 510 and the top by a bottom surface of the bottom panel 514. In some aspects, as shown in the example of FIGS. 5A-5B, there are three blocks 510, which form two pairs of blocks 510, with each pair of blocks 510 defining a particular lift slot 516. Thus, in the example implementation, there are two lift slots 516 that extend from the front face of the data center rack system 500 to the back face of the data center rack system 500 and under the bottom panel 514. A width, W1, of the lift slots 516, in some aspects, may be sized (e.g., by the positioning of the blocks 510) to accept lifting members (e.g., forks) of a lifting machine (e.g., a forklift, hand truck, or other lifting machine). In some aspects, locations of the blocks 510 may be adjustable (e.g., slideably along a width of the bottom panel 514 transverse to the open front and back faces of the data center rack system 500) to vary the width, W1, of one or more of the lift slots 516.

As shown in this example implementation, a stringer plate 513 is positioned and connected to a bottom side of the rack bottom 508. For example, as shown, the stringer plate 513 may be connected to bottom surfaces of the blocks 510 and extend a width and length of the rack system 500 (e.g., of the bottom panel 514), thereby "sandwiching" the blocks 510 between the bottom panel 514 and the stringer plate 513. In some aspects, the stringer plate 513 may prevent or help prevent the data center rack system 500 from falling off or otherwise undesirably moving from one or more lifting members of a lifting machine during deployment (or other movement) of the data center rack system 500.

The example implementation of the data center rack system 500 shown in these figures also includes seismic constraints 530 coupled to, in this example, the side panels 504 and 506 of the housing. In some aspects, the seismic constraints 530 may provide mechanical isolation (e.g., spring isolation) for the data center rack system 500 when installed within a data center. In addition, in some aspects, blocks 510 can be made of isolation material or materials (e.g., spring material, compressible material) and designed for different loads (e.g., seismic or otherwise) as needed. Thus, the blocks 510 along with the constraints 530 may provide seismic or force isolation during deployment, installation, and/or operation.

As further shown in FIGS. 5A-5C, this example implementation of the data center rack system 500 includes one or more connections located, for example, in the rack bottom 508 of the data center rack system 500. In this example, a cooling fluid inlet 518 and a cooling fluid outlet 520 are located in one of the blocks 510. The cooling fluid inlet 518 is sized to receive a flow of a cooling fluid (e.g., a liquid, such as water or refrigerant, or a gas, such as air) to cool the server trays 524 mounted in the data center rack system 500. For example, the cooling fluid (as a gas) may be distributed through outlets (not shown) in the panels 502, 504, 506, or 514, or other structure of the housing. Additional circulation components, such as fans, dampers, or other air circulation equipment, may also be included within the structure of the data center rack system 500. Also, for a liquid cooling source, the data center rack system 500 may also include one or more cooling coils, cold plates, thermosiphons, or other liquid cooling devices.

The cooling fluid outlet 520 may be sized to deliver used cooling fluid (e.g., warmed liquid or air) back to a source of the cooling fluid. In some aspects, one or both of the inlet 518 or outlet 520 may be quick connect, blind-mate fluid connections that fluidly connect without human or manual effort to a cooling fluid source conduit upon installation of the data center rack system 500 in a data center (e.g., in a support structure for multiple data center rack system 500).

Another example connection in the rack bottom 508, as shown in FIGS. 5A-5C, is a power/network connection 522. As shown, the power/network connection 522 is positioned to receive an electrical power input and a network interface input from an external source of power and communication. In some aspects, electrical power and network connectivity is installed within the data center rack system 500 from the power/network connection 522, through a utility track 528 that extends within the volume of the data center rack system 500, such as vertically from the bottom panel 514 to the top panel 502, as shown. The utility track 528 may include multiple utility connections 544 (for power and network connections) to which the server trays 524 may connect to receive electrical power and network communications. In some aspects, a network connection of the connection 522 may be copper (electrical) or fiber (optical) in nature. Also, the power connection of the connection 522 may receive direct or alternating current of various voltages.

Although illustrated in this example as located on a side of the rack bottom 508 and directed laterally from the side, the connections 518, 520, and 522 may also be directed downward from the rack bottom 508 instead of to the side. In such fashion, when the data center rack system 500 is lowered or otherwise moved into a deployment position, the connections 518, 520, and 522 mate with external connections (e.g., sources of cooling fluid, power, network). In some aspects, the connections 518, 520, and 522 may be recessed for protection (e.g., during transportation and deployment of the system 500) thereby requiring another step to actuate the connections.

Turning to FIG. 5D, this figure shows a bottom portion of another example implementation of the data center rack system 500. In this example implementation, lifting slots are defined in two directions within the rack bottom 508; both parallel to an axis that extends from the front face to the back face of the data center rack system 500 (e.g., parallel to a length, L, as shown in FIG. 5C) and orthogonal to that axis. Thus, as shown, the blocks 550 in this implementation are more n-cube shaped than rectangular cuboid shaped (as shown in FIGS. 5A-5B). As shown in FIG. 5D, the blocks 550, in addition to defining lift slots 516 that extend parallel to the axis, also define lift slots 552, which extend below the bottom panel 514 and orthogonal to the axis. The width, W2, of the lift slots 552 may also be sized to accept a lift member (e.g., fork) of a lifting machine (e.g., forklift or hand truck or other lifting machine). In some aspects, locations of the blocks 550 may be adjustable (e.g., slideably along a length of the bottom panel 514 parallel to the open front and back faces of the data center rack system 500) to vary the width, W2, of one or more of the lift slots 552.

In an example operation involving the data center rack system 500, one or more server trays 524 may be installed into the data center rack system 500. In some aspects, the data center rack system 500 may be filled with server trays 524 such that the volume of the data center rack system 500 is completely filled. In some aspects, each server tray 524 may be connected to a particular utility connection 544 once that server tray 524 is installed into the data center rack system 500. Thus, prior to deployment of the data center rack system 500 into a data center, the server trays 524 may be already connected to receive power and network communications.

Next, a lifting machine is positioned to lift and move the loaded data center rack system 500. In some aspects, the lifting machine may be a forklift or hand truck. In some aspects, the lifting machine may be the automated service machine 400 or 450. Generally, the lifting machine is capable of lifting and moving the loaded data center rack system 500 for deployment in a data center, such as deployed in a rack support system located at a base or ground floor level or above the base or ground floor level. For example, in some aspects, the lifting machine may be capable of lifting the loaded data center rack system 500 to heights greater than a height of the data center rack system 500 itself, such as to place it in a middle or top layer of a multi-layer rack support structure as shown in FIG. 1, 2A, or 3A.

The lifting machine adjusts one or more lifting members (e.g., forks) to enter one or more of the lift slots 516 or 552. The lifting members may then be adjusted by the lifting machine to raise and contact the rack bottom 508 of the data center rack system 500 to lift the loaded data center rack system 500 from the ground.

The data center rack system 500 may then be moved and lifted by the lifting machine for deployment in the data center. For example, the data center rack system 500 may be placed, by the lifting machine, into one of the rack support structures shown in FIG. 2A-2B or 3A-3C. In these examples, the rack support structure defines IT layers (e.g., layers 211 and 313) and network layers (e.g., layers 215 and 340). Depending on the payload of the loaded data center rack system 500 (e.g., IT or networking), the lifting machine may deploy the data center rack system 500 in the appropriate layer.

In some aspects, deployment of the data center rack system 500 into the rack support structure may also connect the cooling fluid connections 518 and 520 to a supply and return, respectively, of a cooling fluid source, such as liquid or air. For example, upon deploying the data center rack system 500 into the support structure, the connections 518 and 510, as quick connect, blind-mate connections, may automatically connect to the supply and return connections of the cooling fluid source.

In some aspects, deployment of the data center rack system 500 into the rack support structure may also connect the power/network connection 522 to an electrical power source and a network communication source already installed in the rack support structure. Thus, upon deployment of the data center rack system 500 into the rack support structure, the server trays 524 may be automatically connected to electrical power and a data center network, e.g., through the connection 522, utility track 528, and utility connections 544.

Figure 6:
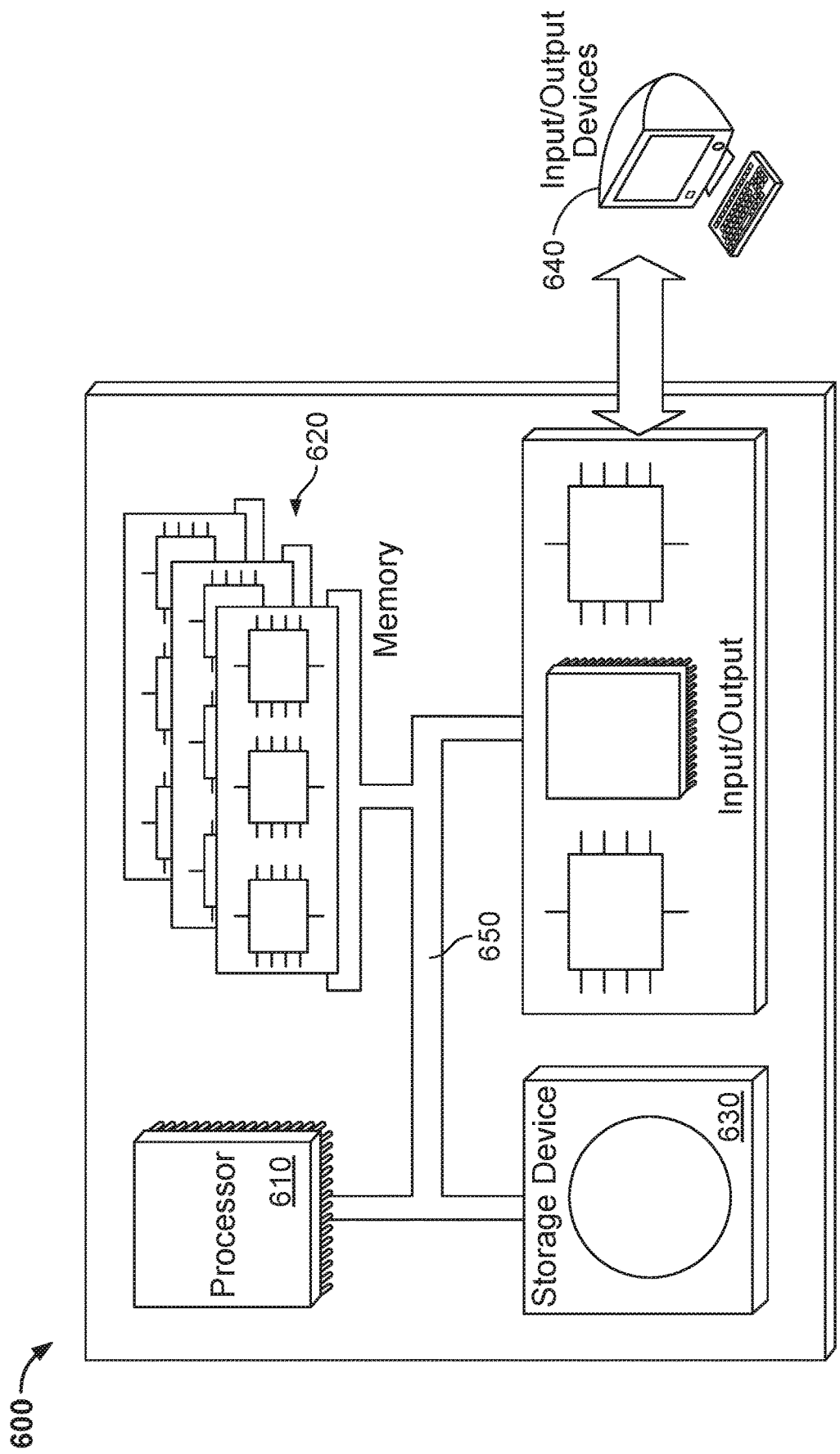
FIG. 6 is a schematic illustration of an example controller for a data center IT equipment servicing system according to the present disclosure.

FIG. 6 is a schematic illustration of an example controller 600 (or control system) for an automated service machine according to the present disclosure. For example, the controller 600 may include or be part of the control system 402 shown in FIGS. 4A-4B. The controller 600 is intended to include various forms of digital computers, such as printed circuit boards (PCB), processors, digital circuitry, or otherwise that is part of a vehicle. Additionally the system can include portable storage media, such as, Universal Serial Bus (USB) flash drives. For example, the USB flash drives may store operating systems and other applications. The USB flash drives can include input/output components, such as a wireless transmitter or USB connector that may be inserted into a USB port of another computing device.

The controller 600 includes a processor 610, a memory 620, a storage device 630, and an input/output device 640. Each of the components 610, 620, 630, and 640 are interconnected using a system bus 650. The processor 610 is capable of processing instructions for execution within the controller 600. The processor may be designed using any of a number of architectures. For example, the processor 610 may be a CISC (Complex Instruction Set Computers) processor, a RISC (Reduced Instruction Set Computer) processor, or a MISC (Minimal Instruction Set Computer) processor.

In one implementation, the processor 610 is a single-threaded processor. In another implementation, the processor 610 is a multi-threaded processor. The processor 610 is capable of processing instructions stored in the memory 620 or on the storage device 630 to display graphical information for a user interface on the input/output device 640.

The memory 620 stores information within the controller 600. In one implementation, the memory 620 is a computer-readable medium. In one implementation, the memory 620 is a volatile memory unit. In another implementation, the memory 620 is a non-volatile memory unit.

The storage device 630 is capable of providing mass storage for the controller 600. In one implementation, the storage device 630 is a computer-readable medium. In various different implementations, the storage device 630 may be a floppy disk device, a hard disk device, an optical disk device, or a tape device.

The input/output device 640 provides input/output operations for the controller 600. In one implementation, the input/output device 640 includes a keyboard and/or pointing device. In another implementation, the input/output device 640 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, for example, in a machine-readable storage device for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer. Additionally, such activities can be implemented via touchscreen flat-panel displays and other appropriate mechanisms.

The features can be implemented in a control system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include a local area network ("LAN"), a wide area network ("WAN"), peer-to-peer networks (having ad-hoc or static members), grid computing infrastructures, and the Internet.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

A number of implementations have been described. Nevertheless, it will be understood that various modifications may be made without departing from the spirit and scope of the disclosure. For example, example operations, methods, or processes described herein may include more steps or fewer steps than those described. Further, the steps in such example operations, methods, or processes may be performed in different successions than that described or illustrated in the figures. Accordingly, other implementations are within the scope of the following claims.

What is claimed is:

1. A data center rack system, comprising:
   a rack housing that comprises side panels and a top panel coupled to the side panels, the top and side panels defining a rack volume sized to enclose a plurality of data center server rack trays, each of the data center server rack trays configured to support a plurality of heat generating electronic devices; and
   a rack bottom coupled to the side panels to at least partially define the rack volume, the rack bottom comprising a bottom panel having a top surface coupled to the side panels and a plurality of blocks coupled to a bottom surface of the bottom panel opposite the top surface, at least one pair of the plurality of blocks defining an opening between the blocks and below the bottom surface of the bottom panel and sized to receive a lifting member of a lifting machine, the rack bottom further comprising a cooling liquid inlet and a cooling liquid outlet, where at least one block of the at least one pair of the plurality of blocks is slidable along a dimension of the bottom panel to vary a size of the opening between the at least one pair of the plurality of blocks;
   a utility track that extends from the rack bottom, through the rack volume, and to the top panel along at least one of the side panels, the utility track comprising a plurality of electric power outlets electrically coupled to at least one electrical power inlet mounted on the rack housing; and a plurality of network outlets communicably coupled to at least one network connection mounted on the rack housing.

2. The data center rack system of claim 1, wherein the side panels are integrally formed with the top panel and the bottom panel.

3. The data center rack system of claim 1, wherein the plurality of blocks comprise at least three blocks, each of the at least three blocks extending in contact with the bottom surface of the bottom panel from a front edge of the bottom panel to a back edge of the bottom panel and in parallel with a width of the side panels.

4. The data center rack system of claim 3, wherein the at least three blocks comprise at least two pairs of blocks, a first pair of the blocks defining a first opening between the first pair of blocks and below the bottom surface of the bottom panel and sized to receive a first lifting member of the lifting machine, a second pair of the blocks defining a second opening between the second pair of blocks and below the bottom surface of the bottom panel and sized to receive a second lifting member of the lifting machine.

5. The data center rack system of claim 4, wherein the first opening is defined by a length that extends from the front edge of the bottom panel to the back edge of the bottom panel and a width that extends between respective blocks of the first pair of blocks, the length being greater than the width.

6. The data center rack system of claim 1, wherein the rack bottom further comprises the at least one electrical power inlet.

7. The data center rack system of claim 1, wherein the rack bottom further comprises the at least one network connection.

8. The data center rack system of claim 1, wherein the plurality of blocks comprise at least three blocks, each of the at least three blocks extending in contact with the bottom surface of the bottom panel from a first side edge of the bottom panel to a second side edge of the bottom panel and orthogonally with a width of the side panels.

9. The data center rack system of claim 1, further comprising at least one seismic restraint coupled to the housing.

10. The data center rack system of claim 5, further comprising at least one seismic restraint coupled to the housing.

11. The data center rack system of claim 1, wherein at least one side panel comprises perforations sized to allow a cooling airflow to circulate into the rack volume from an external environment and limit electrical or cellular wavelength interference into the rack volume from the external environment.

12. The data center rack system of claim 1, further comprising a plurality of cooling fluid outlets formed in at least one of the top panel, the side panels, or the bottom panel and fluidly coupled to one or more fluid circulation components mounted in or to the rack housing.

13. The data center rack system of claim 1, wherein each of the plurality of blocks is a cube or cuboid.

* * * * *